(12) United States Patent
Asakura

(10) Patent No.: US 12,149,857 B2
(45) Date of Patent: Nov. 19, 2024

(54) SOLID-STATE IMAGING DEVICE AND ELECTRONIC APPARATUS

(71) Applicant: SONY SEMICONDUCTOR SOLUTIONS CORPORATION, Kanagawa (JP)

(72) Inventor: Luonghung Asakura, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 407 days.

(21) Appl. No.: 17/310,149

(22) PCT Filed: Jan. 16, 2020

(86) PCT No.: PCT/JP2020/001164
§ 371 (c)(1),
(2) Date: Jul. 21, 2021

(87) PCT Pub. No.: WO2020/158400
PCT Pub. Date: Aug. 6, 2020

(65) Prior Publication Data
US 2022/0094874 A1   Mar. 24, 2022

(30) Foreign Application Priority Data
Jan. 30, 2019 (JP) ................................. 2019-013775

(51) Int. Cl.
*H04N 25/79* (2023.01)
*H04N 17/00* (2006.01)
*H04N 25/75* (2023.01)

(52) U.S. Cl.
CPC ............. *H04N 25/79* (2023.01); *H04N 17/00* (2013.01); *H04N 25/75* (2023.01)

(58) Field of Classification Search
CPC ........ H04N 25/79; H04N 17/00; H04N 25/75; H01L 27/146
See application file for complete search history.

(56) References Cited

U.S. PATENT DOCUMENTS 8,817,146 B2 * 8/2014 Koyama ................ H04N 25/75
348/294
9,380,240 B2 * 6/2016 Yamaoka ............. H04N 25/772
(Continued)

FOREIGN PATENT DOCUMENTS

JP    2002-100753 A    4/2002
JP    2015-185860 A    10/2015
(Continued)

OTHER PUBLICATIONS

International Search Report and Written Opinion of PCT Application No. PCT/JP2020/001164, issued on Feb. 18, 2020, 12 pages of ISRWO.

*Primary Examiner* — Chiawei Chen
(74) *Attorney, Agent, or Firm* — CHIP LAW GROUP

(57) ABSTRACT

The present technology relates to a solid-state imaging device and electronic apparatus capable of relieving wiring failure with less redundancy. The solid-state imaging device includes a pixel array unit in which a plurality of pixels is two-dimensionally arranged in a matrix, one redundant wiring provided for n number of signal lines that transmit a pixel signal from the pixels, and one or more redundant switches that connect one signal line and a redundant wiring. The present technology can be applied to, for example, a solid-state imaging device, or the like.

15 Claims, 30 Drawing Sheets

(56) References Cited

U.S. PATENT DOCUMENTS

| | | | |
|---|---|---|---|
| 10,075,662 B2* | 9/2018 | Kizuna | H04N 25/75 |
| 2002/0017666 A1 | 2/2002 | Ishii et al. | |
| 2009/0108177 A1* | 4/2009 | Chou | H04N 25/677 |
| | | | 438/4 |
| 2011/0001765 A1* | 1/2011 | Hyodo | G09G 3/3688 |
| | | | 341/120 |
| 2011/0080507 A1* | 4/2011 | Iwasa | H03M 1/1225 |
| | | | 348/E5.091 |
| 2013/0126708 A1* | 5/2013 | Blanquart | H04N 25/75 |
| | | | 250/208.1 |
| 2015/0271429 A1* | 9/2015 | Yamaoka | H04N 25/75 |
| | | | 348/301 |
| 2016/0381311 A1* | 12/2016 | Guo | H04N 25/75 |
| | | | 348/308 |
| 2019/0110010 A1 | 4/2019 | Yamamoto | |
| 2019/0297294 A1* | 9/2019 | Goli | H04N 25/68 |
| 2022/0094874 A1* | 3/2022 | Asakura | H04N 25/69 |

FOREIGN PATENT DOCUMENTS

| | | |
|---|---|---|
| JP | 2017-184075 A | 10/2017 |
| JP | 2018-057048 A | 4/2018 |
| JP | 2018-186478 A | 11/2018 |
| WO | 2018/198691 A1 | 11/2018 |

* cited by examiner

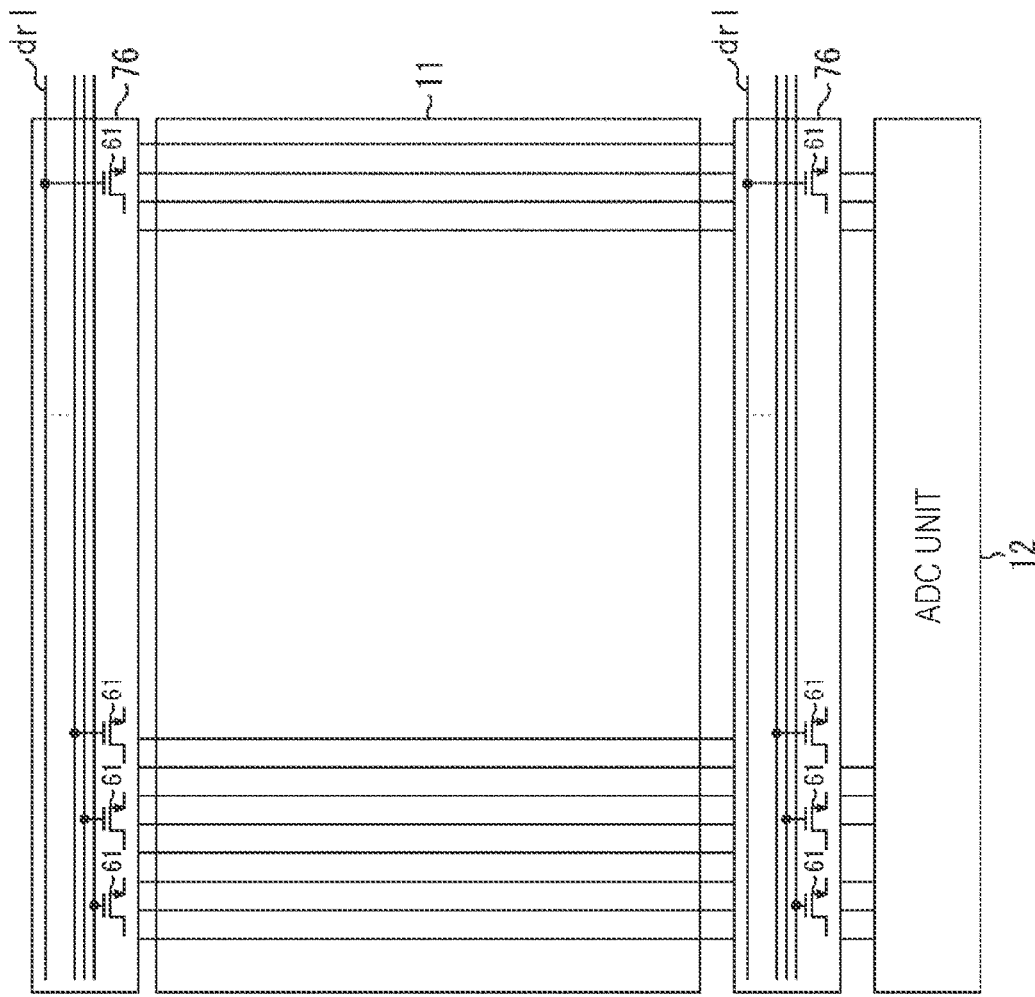

SOLID-STATE IMAGING DEVICE AND ELECTRONIC APPARATUS

CROSS REFERENCE TO RELATED APPLICATIONS

This application is a U.S. National Phase of International Patent Application No. PCT/JP2020/001164 filed on Jan. 16, 2020, which claims priority benefit of Japanese Patent Application No. JP 2019-013775 filed in the Japan Patent Office on Jan. 30, 2019. Each of the above-referenced applications is hereby incorporated herein by reference in its entirety.

TECHNICAL FIELD

The present technology relates to a solid-state imaging device and an electronic apparatus, and more particularly to a solid-state imaging device and electronic apparatus capable of relieving wiring failure with less redundancy.

BACKGROUND ART

There are increasing number of pixels of image sensors and speed of image sensors. Furthermore, there are increasing number of functions of pixels such as a global shutter or conversion efficiency. In order to achieve such an increase in pixels, speed, or functions, a large number of wirings (for example, control lines and signal lines) are required for pixel array. High density of wirings leads to high probability of occurrence of failure such as a short circuit or disconnection of some wiring.

For example, Patent Document 1 discloses a technique for relieving wiring disconnection failure by providing redundancy by provision, per pixel, of two selection transistors and a different signal line for each of the selection transistors.

CITATION LIST

Patent Document

Patent Document 1: Japanese Patent Application Laid-Open No. 2017-184075

SUMMARY OF THE INVENTION

Problems to be Solved by the Invention

However, in the technique disclosed in Patent Document 1, an area overhead is large because the numbers of selection transistors and signal lines are doubled.

The present technology has been developed to solve such a problem mentioned above and to enable relief of wiring failure with less redundancy.

Solutions to Problems

A solid-state imaging device of a first aspect of the present technology includes a pixel array unit in which a plurality of pixels is two-dimensionally arranged in a matrix, one redundant wiring provided for n number of signal lines that transmit a pixel signal from the pixels, and one or more redundant switches that connect a signal line of the n number of signal lines and the redundant wiring.

A solid-state imaging device of a second aspect of the present technology includes a pixel array unit in which a plurality of pixels is two-dimensionally arranged in a matrix, an ADC that converts an analog pixel signal output by the pixel in the pixel array unit into digital the pixel signal, a signal line that is connected to the ADC and transmits a pixel signal from the pixel to the ADC, and a selection unit that selects a redundant ADC arranged for each of a plurality of the ADCs and any of a plurality of the signal lines, and connects selected the signal line and the redundant ADC.

An electronic apparatus of a third aspect of the present technology includes the solid-state imaging device according to the first aspect or second aspect.

In the first and third aspects of the present technology, a plurality of pixels is two-dimensionally arranged in a matrix in the pixel array unit, one redundant wiring is provided for n number of signal lines that transmit a pixel signal from the pixels, and one or more redundant switches that connect a signal line of the n number of signal lines and the redundant wiring are provided.

In the second and third aspects of the present technology, a plurality of pixels is two-dimensionally arranged in a matrix in the pixel array unit, an analog pixel signal output by the pixel in the pixel array unit is converted by an ADC into digital the pixel signal, a pixel signal from the pixel is transmitted to the ADC by the signal line connected to the ADC, a redundant ADC is arranged for each of a plurality of the ADCs, and the signal line selected from among any of a plurality of the signal lines and the redundant ADC are connected.

The solid-state imaging device or the electronic apparatus may be an independent device or a module incorporated in another device.

BRIEF DESCRIPTION OF DRAWINGS

FIG. 11 is a diagram illustrating a fourth example of arrangement of a redundant switch.

MODE FOR CARRYING OUT THE INVENTION

Figure 1:
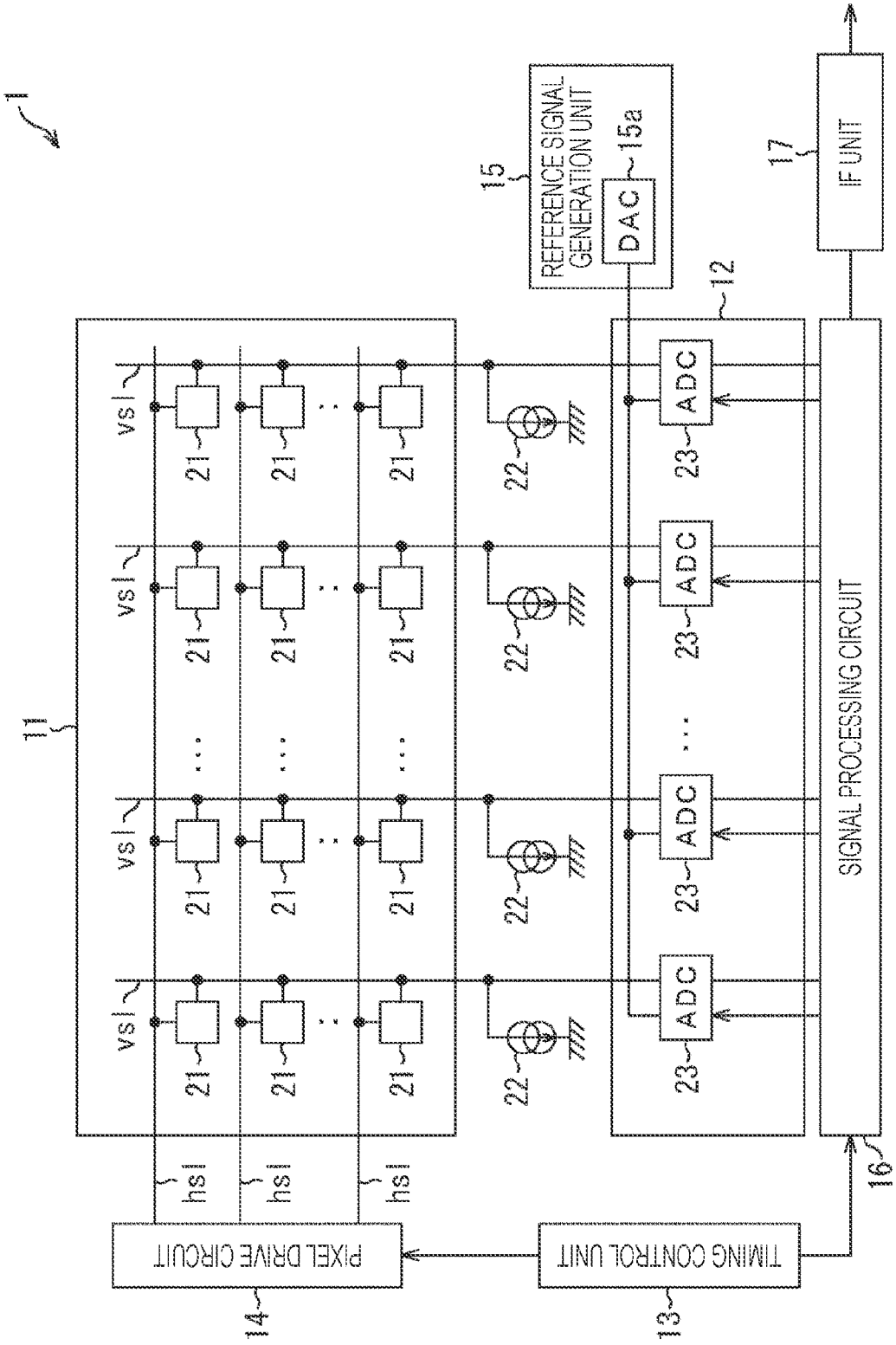
FIG. 1 is a block diagram illustrating an example of a basic configuration of a solid-state imaging device.

A mode for carrying out the present technology (hereinafter, referred to as an embodiment) will be described below. Note that the description will be made in the following order.
1. Example of basic configuration of solid-state imaging device
2. Occurrence of wiring failure
3. Configuration example of first redundant circuit
4. Configuration example of entire solid-state imaging device
5. Application to drive signal line
6. Configuration example of second redundant circuit
7. Configuration example of entire solid-state imaging device
8. Usage example of image sensor
9. Example of application to electronic apparatus
10. Example of application to endoscopic surgery system
11. Example of application to mobile object 1. Example of Basic Configuration of Solid-State Imaging Device Before description of a solid-state imaging device to which the present technology is applied, a basic configuration example of a solid-state imaging device will be described as a precondition.

FIG. 1 is a block diagram illustrating an example of a basic configuration of a solid-state imaging device.

A solid-state imaging device 1 in FIG. 1 is configured including a pixel array unit 11, an ADC unit 12, a timing control unit 13, a pixel drive circuit 14, a reference signal generation unit 15, a signal processing circuit 16, an IF unit 17, or the like.

A plurality of pixels 21 is two-dimensionally arranged in a matrix on the pixel array unit 11.

The plurality of pixels 21 arranged in a matrix is connected to the pixel drive circuit 14 in units of row by a drive signal line hsl. In other words, the plurality of pixels 21 arranged in the same row in the pixel array unit 11 is connected to the pixel drive circuit 14 by the same one drive signal line hsl. Note that, although a drive signal line hsl is illustrated as one wiring in FIG. 1, the wiring is not limited to one.

Each of the pixels 21 in the pixel array unit 11 outputs a pixel signal corresponding to an electric charge accumulated inside to a pixel signal line vsl according to a signal supplied from the pixel drive circuit 14 via a drive signal line hsl. A detailed configuration example of a pixel 21 will be described later with reference to FIG. 2. The plurality of pixels 21 arranged in the same pixel column in the pixel array unit 11 is connected to the same one pixel signal line vsl, and a pixel signal output by each of the pixels 21 is supplied to an analog-to-digital converter (ADC) 23 in the ADC unit 12 via a pixel signal line vsl. A constant current source circuit 22 that forms a source follower circuit with pixels 21 is also connected to the pixel signal line vsl. The constant current source circuit 22 includes a load MOS, or the like.

The ADC unit 12 includes a plurality of ADCs 23. More specifically, in the ADC unit 12, one pixel signal line vsl is provided for one ADC 23. The ADC 23 converts (A-D conversion) an analog pixel signal supplied via the pixel signal line vsl into a digital signal. Each of the ADCs 23 temporarily stores A-D converted pixel data, and outputs the pixel data to the IF unit 17 via the signal processing circuit 16 under control by the signal processing circuit 16.

The timing control unit 13 supplies a clock signal or timing signal necessary for predetermined operation to the pixel drive circuit 14, the signal processing circuit 16, the ADC 23, or the like on the basis of a master clock having a predetermined frequency. For example, the timing control unit 13 supplies a timing signal of shutter operation or read operation of a pixel 21 to the pixel drive circuit 14. Furthermore, although illustration is omitted, the timing control unit 13 supplies a clock signal or timing signal necessary for predetermined operation to an ADC 23, the reference signal generation unit 15, or the like.

For example, the pixel drive circuit 14 determines a position of a row for driving a pixel, generates a drive signal for driving a pixel 21, and supplies the drive signal to the pixel 21 via a drive signal line hsl.

The reference signal generation unit 15 is configured having a digital to analog converter (DAC) 15a, and generates a reference signal having a ramp (RAMP) waveform according to a clock signal from the timing control unit 13 to supply the reference signal to each of the ADCs 23 in the ADC unit 12.

The signal processing circuit 16 sequentially outputs the pixel data stored in the plurality of ADCs 23 in the ADC unit 12 to the IF unit 17 at a predetermined timing. Moreover, the signal processing circuit 16 performs various digital signal processing such as black level adjustment processing, column variation correction processing, or gradation correction processing on pixel data of each of the pixels 21 stored in the ADC 23, as necessary, and supplies the pixel data to the IF unit 17.

The IF unit 17 outputs the pixel data supplied from the signal processing circuit 16 to outside of the device.

The solid-state imaging device 1 configured as described above is a CMOS image sensor called a column AD method in which ADCs 23 are arranged for each pixel column.

A detailed configuration example of a pixel 21 and an ADC 23 will be described later with reference to FIG. 2.

Figure 2:
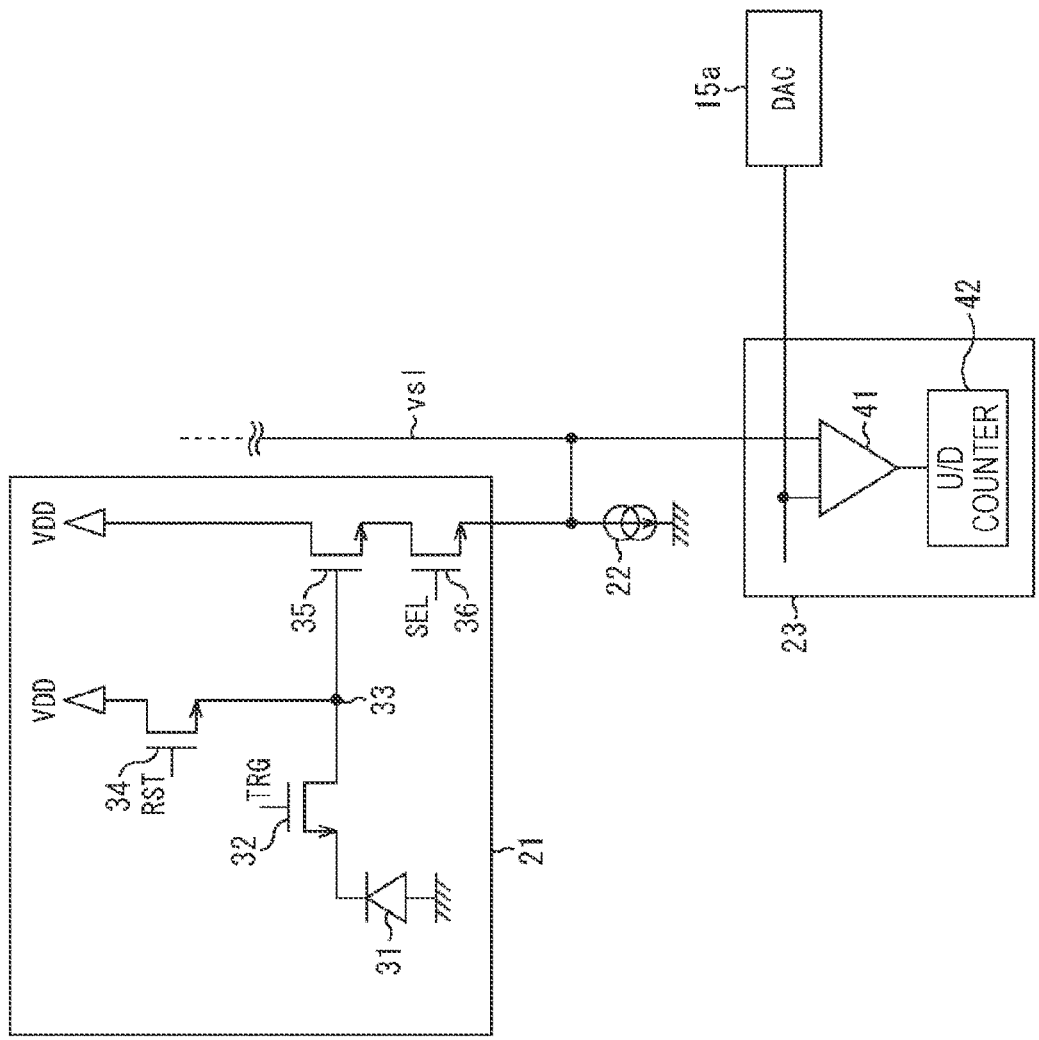
FIG. 2 is a diagram describing a detailed configuration of a pixel and ADC in FIG. 1.

FIG. 2 illustrates a detailed configuration of one pixel 21 in the pixel array unit 11 and an ADC 23, which are connected to one pixel signal line vsl.

The pixel 21 has a pixel circuit that receives and photoelectrically converts incident light and then outputs the pixel signal. Specifically, as a pixel circuit, the pixel 21 has a photodiode 31 as a photoelectric conversion element, a transfer transistor 32, a floating diffusion (FD) 33, a reset transistor 34, an amplification transistor 35, and a selection transistor 36.

The photodiode 31 generates and accumulates an electric charge (signal charge) corresponding to an amount of received light. An anode terminal of the photodiode 31 is grounded, and a cathode terminal of the photodiode 31 is connected to the FD 33 via the transfer transistor 32.

When the transfer transistor 32 is turned on by a transfer signal TRG, the transfer transistor 32 reads an electric charge generated by the photodiode 31 and transfers the electric charge to the FD 33.

The FD 33 retains the electric charge read from the photodiode 31. When the reset transistor 34 is turned on by a reset signal RST, an electric charge accumulated in the FD 33 is discharged to a drain (constant voltage source VDD) to reset an electric potential of the FD 33.

The amplification transistor 35 outputs a pixel signal corresponding to an electric potential of the FD 33. That is, the amplification transistor 35 and a constant current source circuit 22 connected via a pixel signal line vsl constitute a source follower circuit, and a pixel signal indicating a level corresponding to an electric charge accumulated in the FD 33 is output to the ADC 23 from the amplification transistor 35 via the selection transistor 36 and the pixel signal line vsl.

The selection transistor 36 is turned on when the pixel 21 is selected by a selection signal SEL, and outputs a pixel signal of the pixel 21 to the ADC 23 via the pixel signal line vsl. Each drive signal line through which a transfer signal TRG, a selection signal SEL, or a reset signal RST is transmitted corresponds to a drive signal line hsl in FIG. 1.

The pixel 21 can be configured as described above for example, but is not limited to this configuration, and another configuration may be adopted.

The ADC 23 performs correlated double sampling (CDS) processing on a pixel signal supplied from the pixel 21 via the pixel signal line vsl, and further performs A-D conversion processing. The ADC 23 has a comparator (comparator) 41 and an up/down counter (U/D counter) 42.

The pixel signal output from the pixel 21 is input to a first input terminal of the comparator 41 via the pixel signal line vsl. Meanwhile, to a second input terminal of the comparator 41, a reference signal having a so-called ramp (RAMP) waveform, of which level (voltage) changes obliquely as time elapses, is input from the DAC 15a of the reference signal generation unit 15.

The comparator 41 outputs a difference signal obtained by comparing a pixel signal with a reference signal to the up/down counter 42. For example, in a case where the reference signal is larger than the pixel signal, a High (Hi) difference signal is supplied to the up/down counter 42, and in a case where the reference signal is smaller than the pixel signal, a Low (Lo) difference signal is supplied to the up/down counter 42.

The up/down counter 42 counts down only while a Hi difference signal is supplied during a Preset Phase (P-phase) A-D conversion period, and counts up only while a Hi difference signal is supplied during a Data Phase (D-phase) A-D conversion period. Then, the up/down counter 42 outputs a result of addition of a down-count value of the P-phase A-D conversion period to an up-count value of the D-phase A-D conversion period, as pixel data that has been subjected to the CDS processing and the A-D conversion processing. Note that the up/down counter 42 may count up during a P-phase A-D conversion period and may count down during a D-phase A-D conversion period.

2. Occurrence of Wiring Failure

As described with reference to FIGS. 1 and 2, generally one pixel signal line vsl is provided for one pixel column in a basic configuration of a solid-state imaging device.

Figures 3A, 3B:
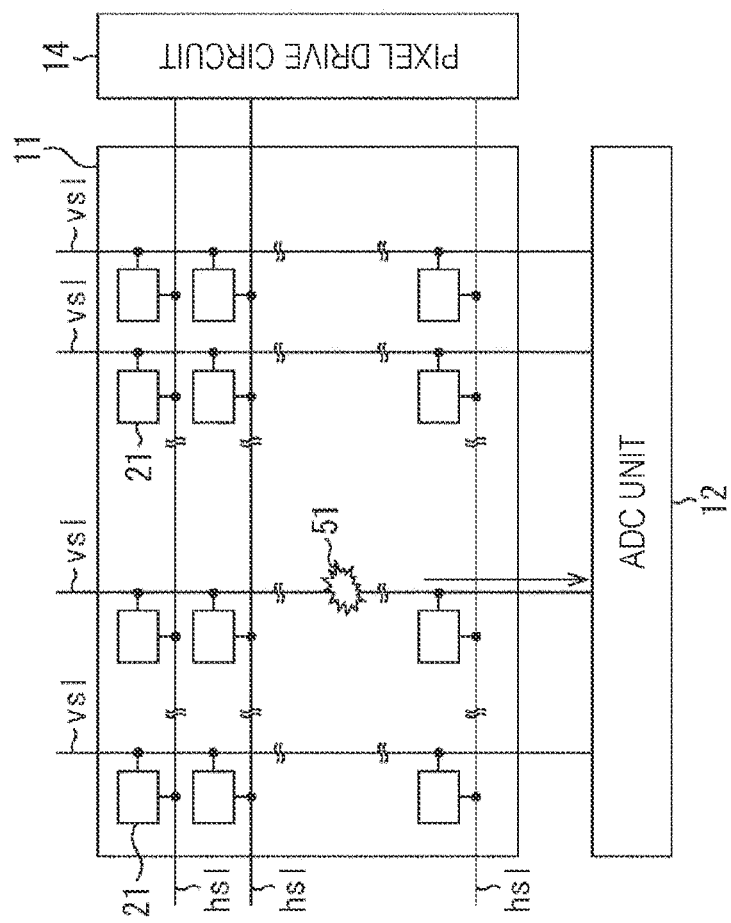
FIGS. 3A and 3B are diagrams describing occurrence of wiring failure.

In this case, for example, if failure such as disconnection occurs at a predetermined point 51 of a predetermined pixel signal line vsl among the plurality of pixel signal lines vsl arranged in the pixel array unit 11 as illustrated in FIG. 3A, a vertical line defect 52 occurs in a captured image as illustrated in FIG. 3B. Such a line defect 52 is easy to see and is more difficult to correct than a point defect. Therefore, in a case where a line defect 52 has occurred, the solid-state imaging device itself is often treated as failure, which causes a decrease in yield of image sensors.

Therefore, the following will describe a circuit configuration capable of improving yield by a solid-state imaging device including a redundant circuit in which a pixel signal line vsl or an ADC 23 is redundantly included so that relief is possible even in a case where failure such as disconnection has occurred in a pixel signal line vsl.

Note that, in the diagrams described below, the parts corresponding to the parts in FIGS. 1 and 2 are provided with the same reference signs, and description of the corresponding parts will be omitted as appropriate. Furthermore, there may be a case where the reference signs provided to the respective parts in FIGS. 1 and 2 are cited for the description as appropriate to facilitate understanding.

3. Configuration Example of First Redundant Circuit

Figure 4:
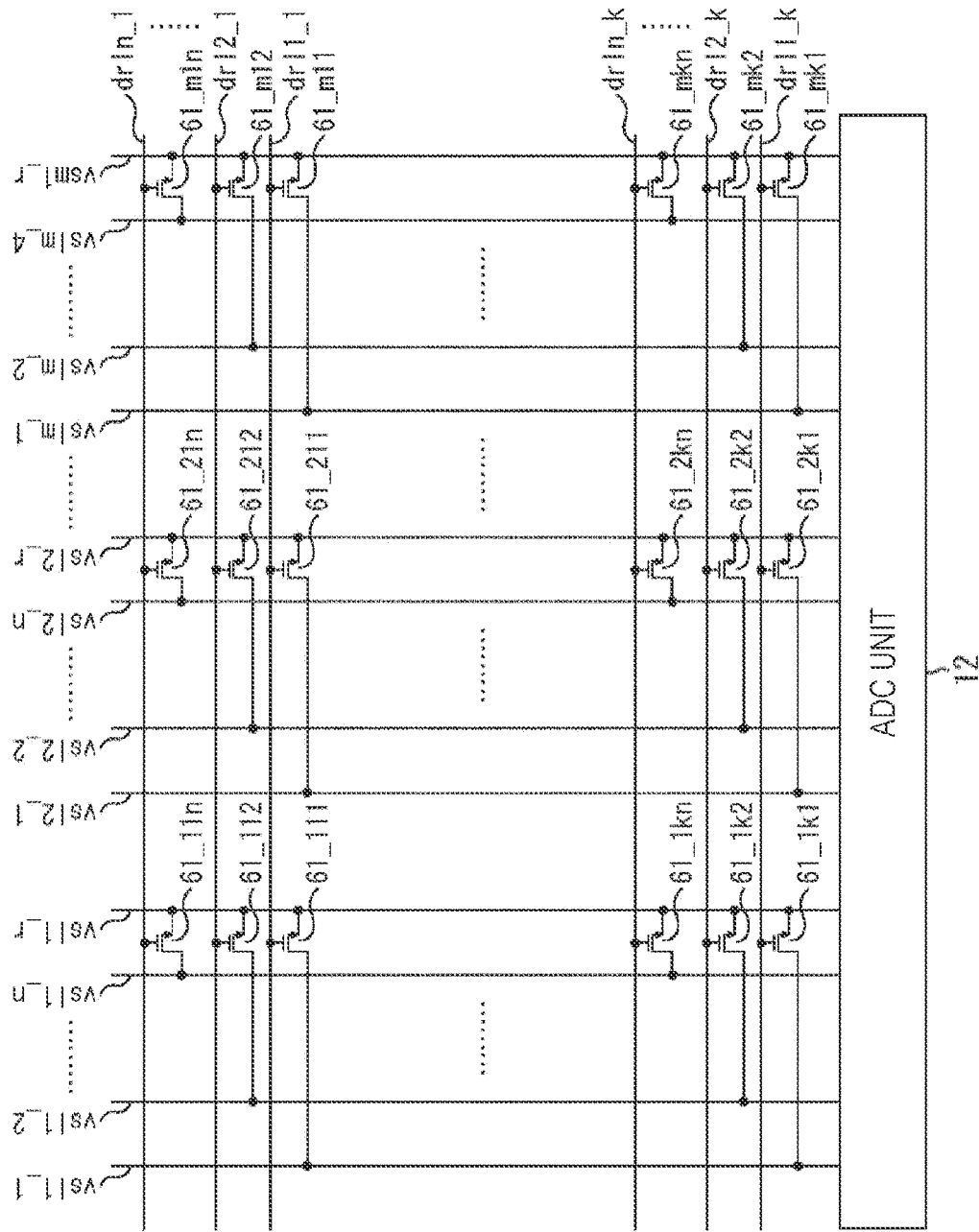
FIG. 4 is a conceptual diagram of a first redundant circuit having a circuit configuration to which the present technology is applied.

FIG. 4 is a conceptual diagram of a first redundant circuit having a circuit configuration to which the present technology is applied.

In the circuit in FIG. 4, one redundant pixel signal line (hereinafter referred to as a redundant wiring) vsl is arranged for n number of pixel signal lines vsl.

More specifically, in FIG. 4, one redundant wiring vsl1_r is provided for n number of pixel signal lines vsl1_1 to vsl1_n and one redundant wiring vsl2_r is provided for n number of pixel signal lines vsl2_1 to vsl2_n, and similarly, one redundant wiring vslm_r is provided for n number of pixel signal lines vslm_1 to vslm_n (m is an integer of 2 or more).

Furthermore, between one redundant wiring vsl and each of n number of pixel signal lines vsl, two or more redundant switches 61 for connecting the pixel signal line vsl and the redundant wiring vsl are provided. A redundant switch 61 includes, for example, an N-type MOS transistor, and turns on/off connection between a pixel signal line vsl and a redundant wiring vsl with a control signal supplied to a gate.

For example, k number of redundant switches 61_111 to 61_1k1 are provided between the pixel signal line vsl1_1 and the redundant wiring vsl1_r, and k number of redundant switches 61_112 to 61_1k2 are provided between the pixel signal line vsl1_2 and the redundant wiring vsl1_r. Between the pixel signal line vsl1_n and the redundant wiring vsl1_r, k number of redundant switches 61_11n to 61_1kn are provided (k is an integer of 2 or more).

Furthermore, k number of redundant switches 61_211 to 61_2k1 are provided between the pixel signal line vsl2_1 and the redundant wiring vsl2_r, and k number of redundant switches 61_212 to 61_2k2 are provided between the pixel signal line vsl2_2 and the redundant wiring vsl2_r. Between the pixel signal line vsl2_n and the redundant wiring vsl2_r, k number of redundant switches 61_21n to 61_2kn are provided.

Similarly, k number of redundant switches 61_m11 to 61_mk1 are provided between the pixel signal line vslm_1 and the redundant wiring vslm_r, and k number of redundant switches 61_m12 to 61_mk2 are provided between the pixel signal line vslm_2 and the redundant wiring vslm_r. Between the pixel signal line vslm_n and the redundant wiring vslm_r, k number of redundant switches 61_m1n to 61_mkn are provided.

Figure 5:
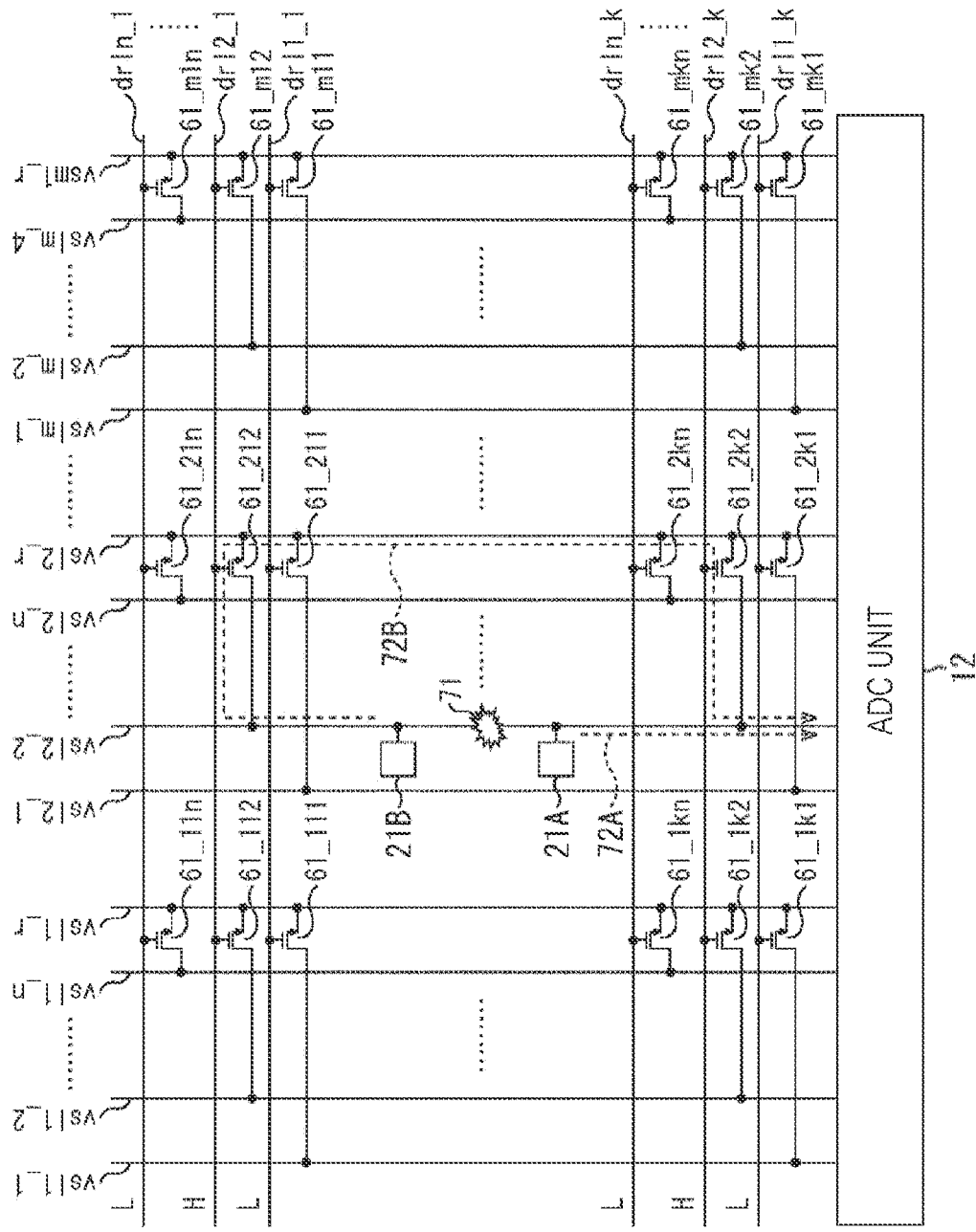
FIG. 5 is a diagram illustrating a relief method in a case where disconnection has occurred in a predetermined pixel signal line vsl.

FIG. 5 is a diagram illustrating a relief method in a case where disconnection has occurred in a predetermined pixel signal line vsl in the first redundant circuit illustrated in FIG. 4.

For example, as illustrated in FIG. 5, it is assumed that disconnection has occurred in a predetermined point 71 (hereinafter, referred to as a disconnected point 71) of the pixel signal line vsl2_2.

In this case, of all the redundant switches 61 that connect a pixel signal line vsl and a redundant wiring vsl, a control signal that transmits drive signal lines drl2_1 to drl2_k is controlled to Hi, and another control signal that transmits drive signal lines drl1 and drl3 to drln is controlled to Lo. As redundant switches 61 related to the disconnected point 71, the redundant switch 61_212 and the redundant switch 61_2k2 are turned on, and other redundant switches 61 are turned off.

Of a plurality of pixels 21 connected to the pixel signal line vsl2_2 in which the disconnection has occurred, a pixel 21 between the disconnected point 71 and the ADC unit 12 (for example, a pixel 21A) can output a pixel signal to the ADC unit 12 via a path 72A. The path 72A is a route of the pixel signal line vsl2_2.

Meanwhile, of a plurality of pixels 21 connected to the pixel signal line vsl2_2 in which disconnection has occurred, a pixel 21 on an opposite side to the ADC unit 12 across the disconnected point 71 (for example, a pixel 21B) can output a pixel signal to the ADC unit 12 via a path 72B. The path 72B is a route for the pixel signal line vsl2_2, the redundant switch 61_212, the redundant wiring vsl2_r, the redundant switch 61_2k2, and the pixel signal line vsl2_2.

Thus, by providing one redundant wiring vsl for n number of pixel signal lines vsl and providing redundant switches 61 between the redundant wiring vsl and each of the pixel signal lines vsl, the number of redundant wirings vsl can be reduced, and the number of redundant switches 61 can be reduced to the number smaller than the number of pixels, as compared to a case where a redundant wiring vsl is provided for each pixel signal line vsl. With this arrangement, an area of a circuit required to achieve redundancy can be reduced, and therefore a redundant circuit overhead can be reduced.

Therefore, with the first redundant circuit to which the present technology is applied, it is possible to relieve wiring failure with less redundancy.

A value of n, which is the number of pixel signal lines vsl for one redundant wiring vsl, can be determined as appropriate according to a characteristic (operation condition) or the like of the solid-state imaging device. Furthermore, the number of pixel signal lines vsl to be arranged for one pixel column is only required to be determined according to speed of reading request of a pixel signal, or the like.

Example of Arrangement of Redundant Wirings Vsl

Figure 6:
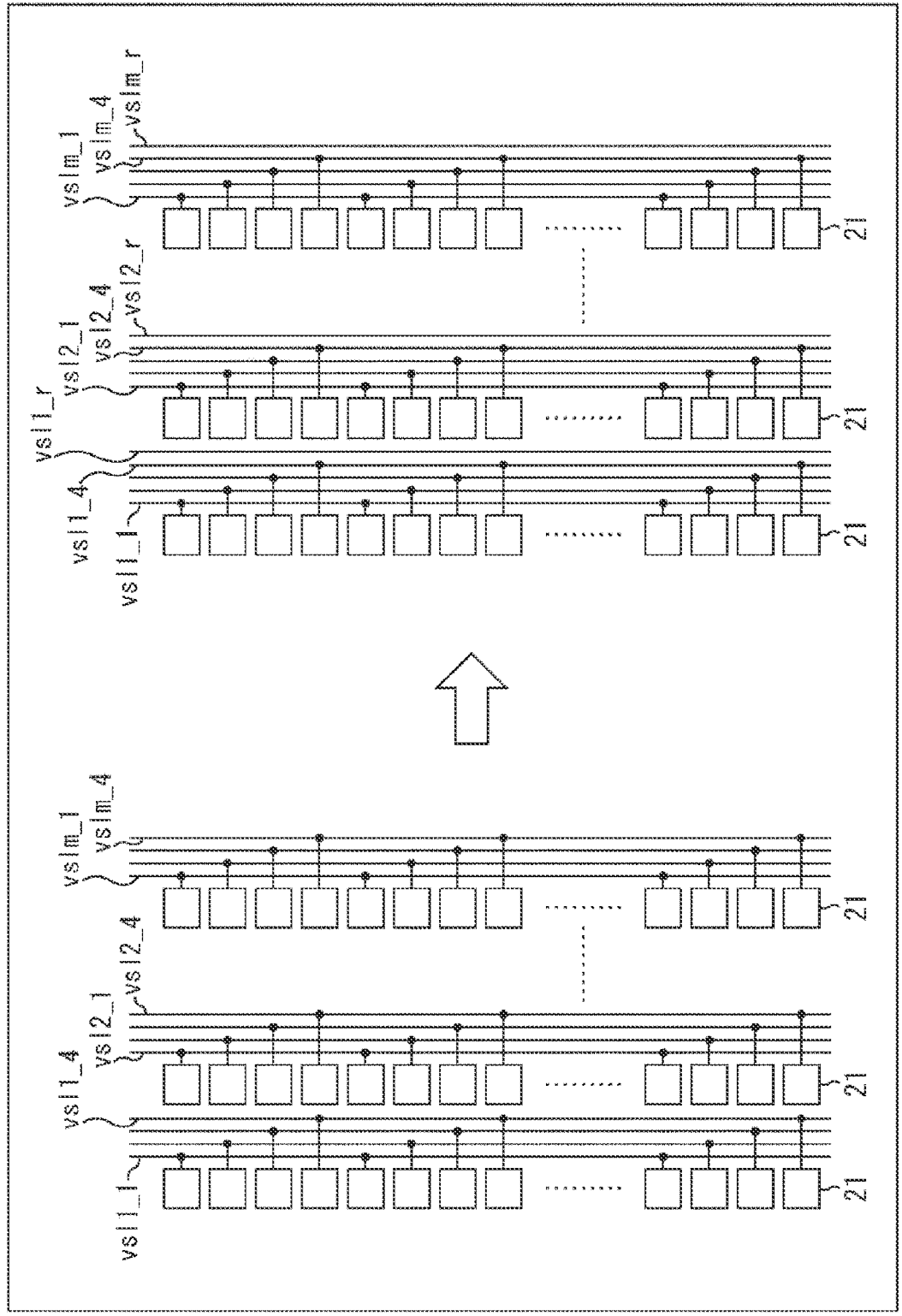
FIG. 6 is a diagram illustrating an example of arrangement of redundant wirings vsl.
Figure 7:
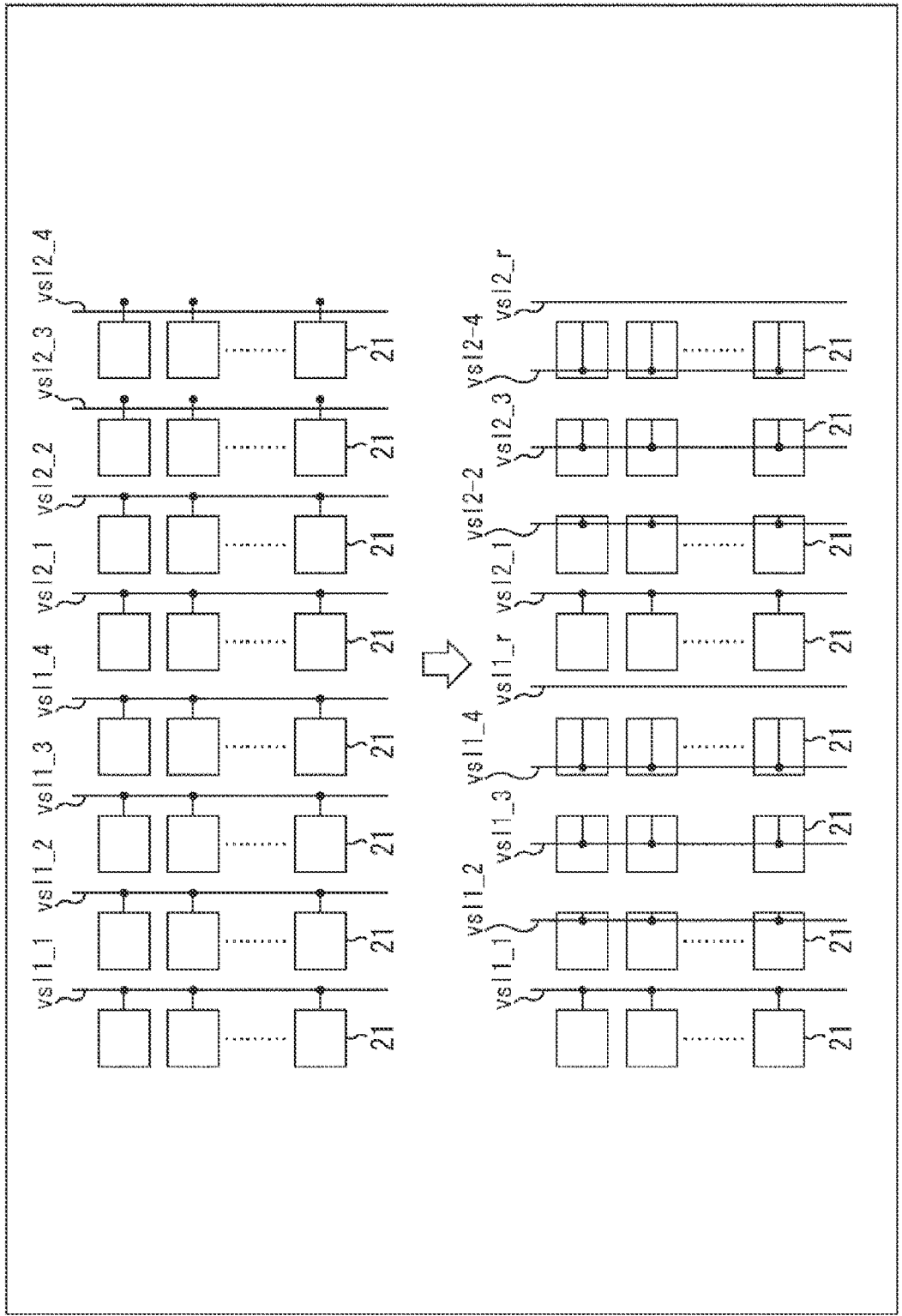
FIG. 7 is a diagram illustrating an example of arrangement of redundant wirings vsl.

FIGS. 6 and 7 illustrate examples of arrangement of redundant wirings vsl.

Both FIGS. 6 and 7 are examples in which one redundant wiring vsl is provided for four pixel signal lines vsl, and FIG. 6 illustrates an example of wiring in which redundant wirings vsl are provided in a solid-state imaging device having a high frame rate that enables simultaneous reading of four rows of pixels.

In FIG. 6, four pixel signal lines vsl and one redundant wiring vsl are arranged in one pixel column. In other words, four pixel signal lines vsl are arranged in one pixel column, and one redundant wiring vsl is added in units of pixel column.

Meanwhile, in FIG. 7, four pixel signal lines vsl and one redundant wiring vsl are arranged in four pixel columns. Pixel signal reading speed in this case is slower than pixel signal read speed in a case of FIG. 6. Note that, in FIG. 7, intervals of the pixel signal lines vsl are narrower than a pixel pitch, because intervals of all pixel signal lines vsl including a redundant wiring vsl are arranged so as to be evenly spaced in a horizontal direction.

Example of Arrangement of Redundant Switches 61

FIGS. 8 to 11 illustrate an example of arrangement of the redundant switches 61 in the pixel array unit 11.

Figure 8:
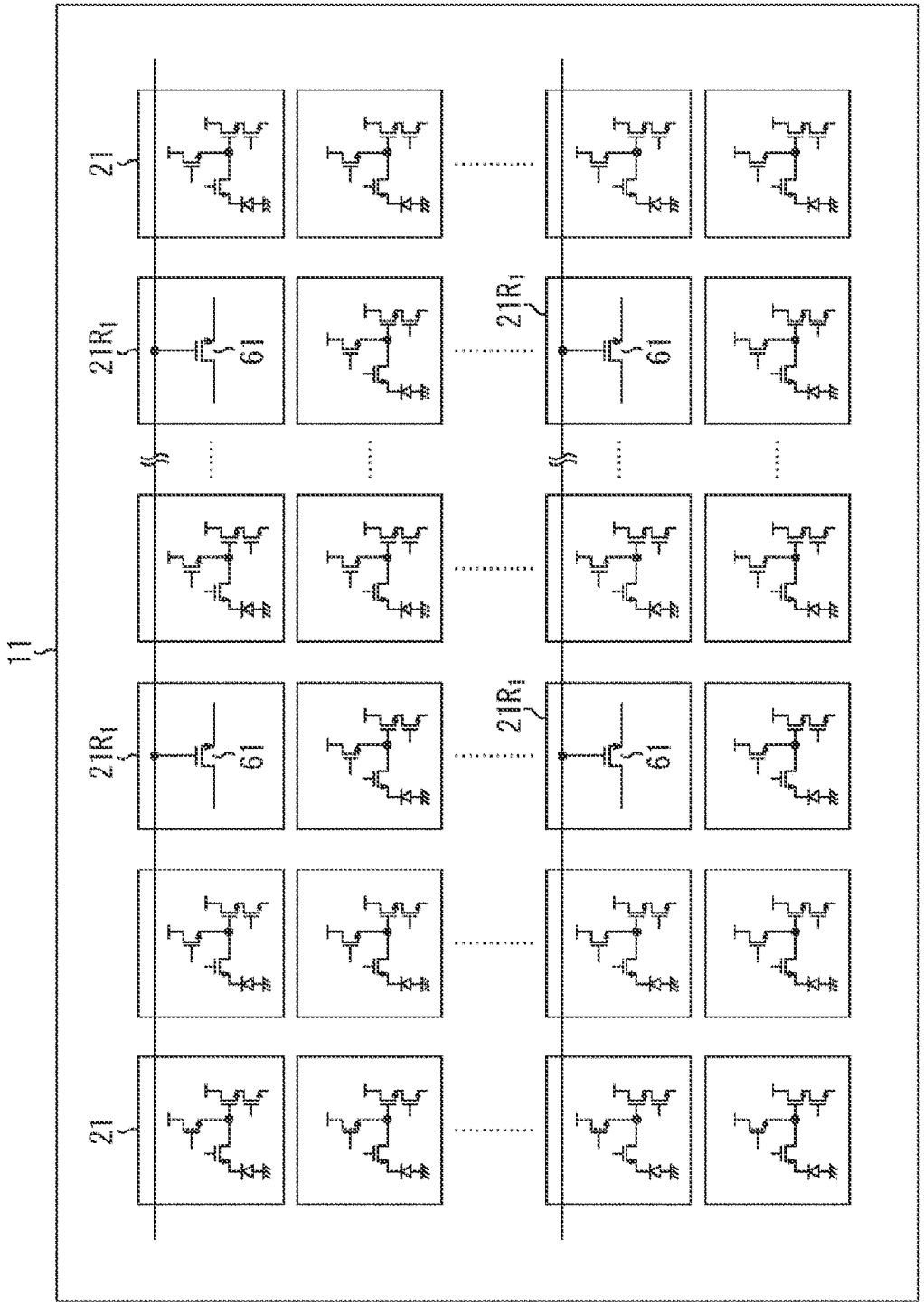
FIG. 8 is a diagram illustrating a first example of arrangement of redundant switches.

FIG. 8 illustrates a first example of arrangement of the redundant switches 61.

In the first arrangement example in FIG. 8, pixels $21R_1$ are arranged at predetermined locations in the pixel array unit 11 instead of pixels 21 having a pixel circuit. The pixel $21R_1$ is a pixel from which the pixel circuit is deleted and a redundant switch 61 is arranged.

In this first arrangement example, pixels 21R are defect pixels for not being able to generate a pixel signal, which are however scattered point defects. Therefore, the scattered point defects are less noticeable and easier to correct than line defects in a case of when disconnection is not relieved.

Figure 9:
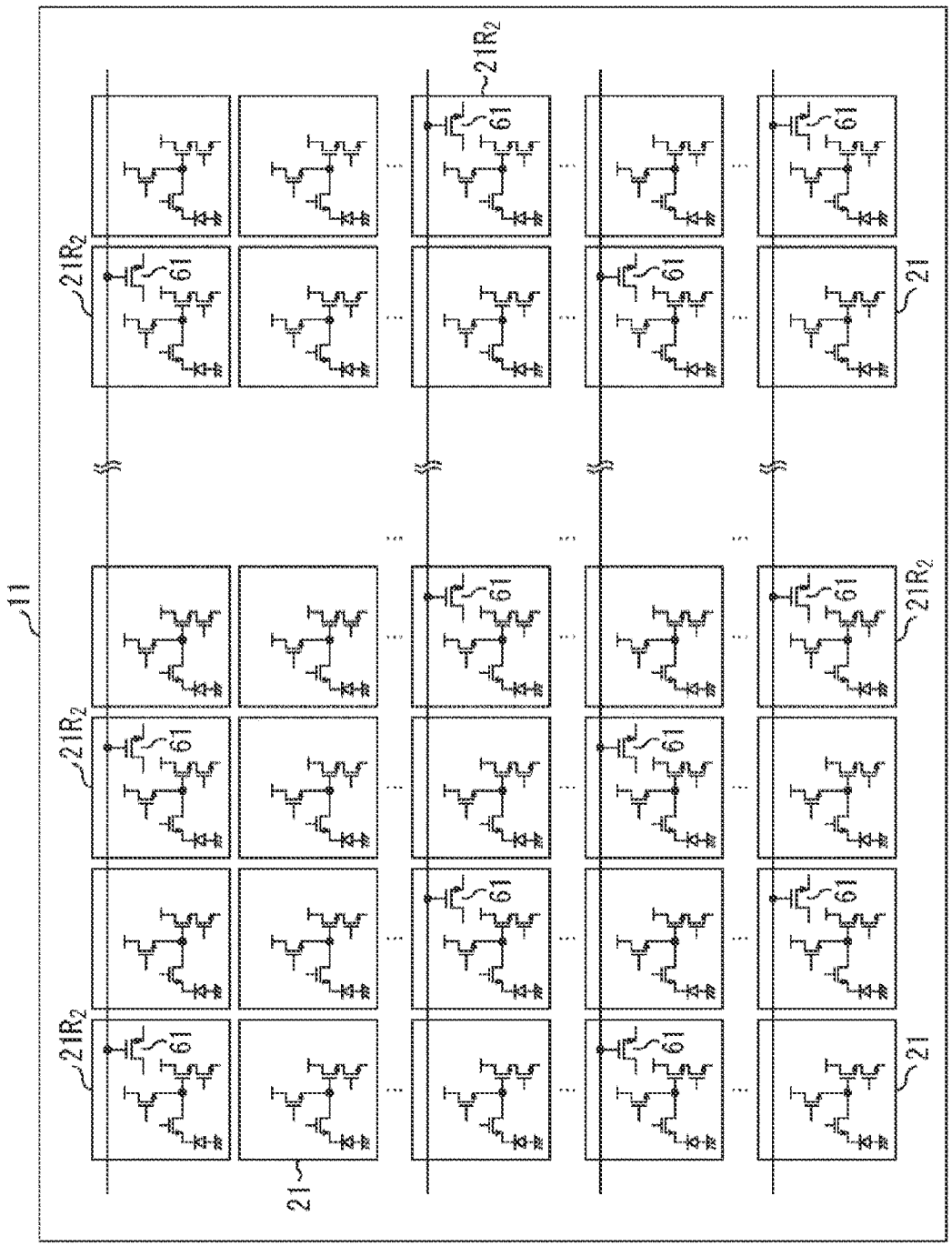
FIG. 9 is a diagram illustrating a second example of arrangement of a redundant switch.

FIG. 9 illustrates a second example of arrangement of the redundant switches 61.

In the second example of arrangement in FIG. 9, the pixels $21R_2$ are arranged at predetermined locations in the pixel array unit 11. A pixel $21R_2$ is a pixel having the same pixel circuit as another pixel 21 has and a redundant switch 61.

According to the second example of arrangement, a pixel signal can be output even in a pixel $21R_2$ in the same manner as the another pixel 21 does while implementing a redundancy function. Although a pixel $21R_2$ ideally has the same light receiving characteristic as a pixel 21 without a redundant switch 61 does, there may be a case where the light receiving characteristic decreases due to a narrowed opening region caused by an arranged redundant switch 61. However, because sensitivity correction processing can be executed in the signal processing circuit 16 in an output stage, less damage is caused as compared to point defects in the first example of arrangement.

Note that, although a redundant switch 61 is additionally provided for some pixels 21 among the plurality of pixels 21 in the pixel array unit 11 in FIG. 9, all the pixels 21 in the pixel array unit 11 may be provided with a redundant switch 61. In this case, symmetry of the pixels 21 is improved, and therefore uniformity of characteristics of each of the pixels 21 is improved.

Figure 10:
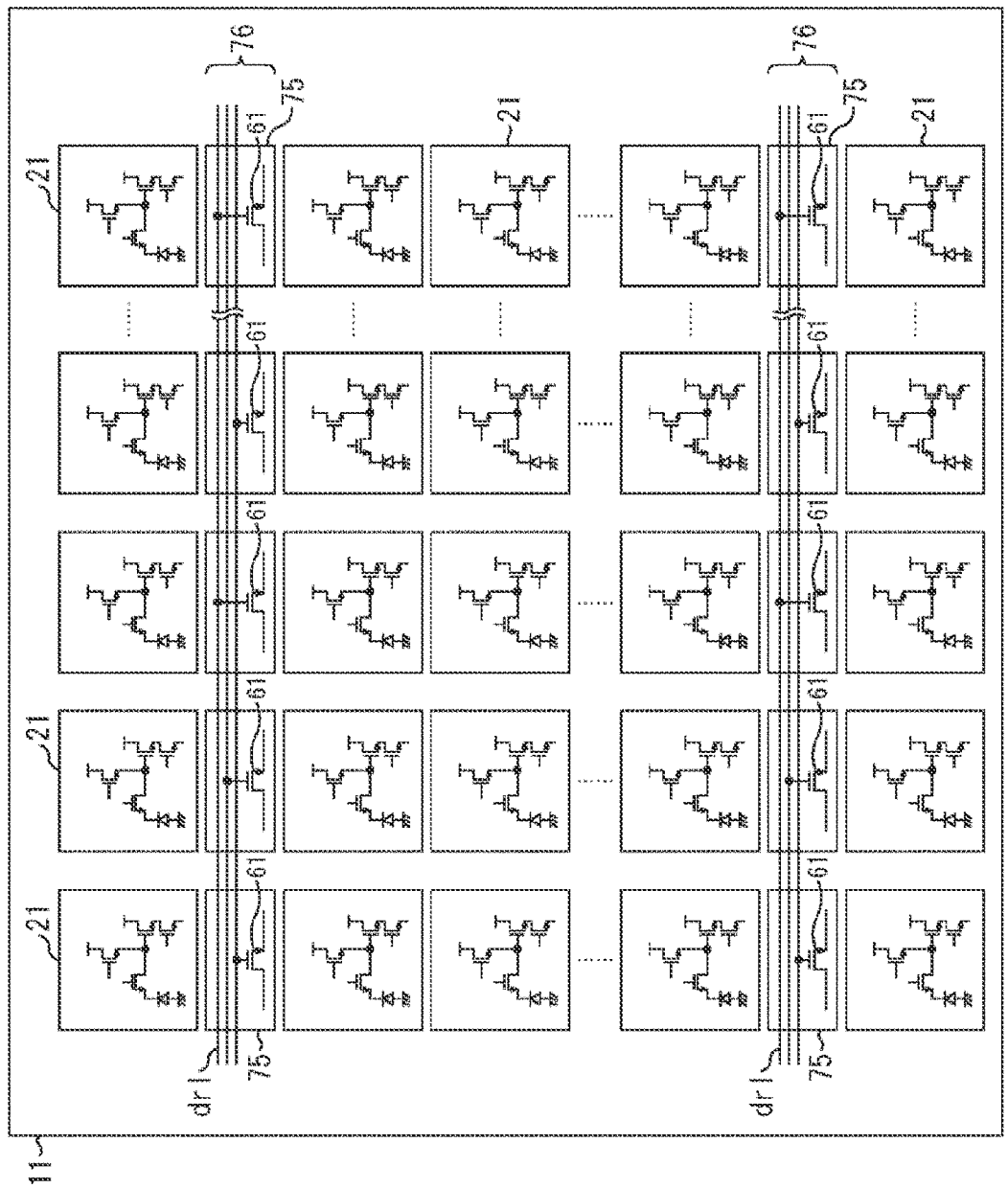
FIG. 10 is a diagram illustrating a third example of arrangement of a redundant switch.

FIG. 10 illustrates a third example of arrangement of the redundant switches 61.

In the third example of arrangement in FIG. 10, redundant switch rows 76 are provided at locations different from pixel rows in which the pixels 21 are arranged in the pixel array unit 11, the redundant switch rows 76 being rows dedicated to pixels 75 in which redundant switches 61 are arranged. In other words, a redundant switch row 76 is provided between two vertically aligned different pixel rows.

According to the third arrangement example, the redundant switch row 76 requires a circuit area necessary only for arranging a redundant switches 61 and the drive signal lines drl thereof, and therefore a width of a pixel 75 in the vertical direction can be configured narrower than a width of a pixel 21, which results in a reduction in effect on a pixel characteristic.

FIG. 11 illustrates a fourth example of arrangement of the redundant switches 61.

Although the redundant switches 61 and the drive signal lines drl thereof are arranged in the pixel array unit 11 in all of the first to third examples of arrangement described above, the redundant switches 61 and the drive signal lines drl thereof are arranged outside of the pixel array unit 11 in the fourth example of arrangement in FIG. 11. More specifically, the redundant switch rows 76 in which redundant switches 61 and the drive signal lines drl thereof are arranged are arranged outside of the pixel array unit 11 in the vertical direction, which is both end sides of the pixel signal lines vsl.

According to the fourth example of arrangement, arrangement of the redundant switches 61 and the drive signal lines drl thereof does not affect a semiconductor layer of each of the pixels 21 in which photoelectric conversion region is formed, and therefore there is no deterioration in image quality due to arrangement of the redundant switches 61. However, there may be a case where read time is longer, because a detour path for when relieving disconnection is longer.

Example of Arrangement of Redundant Switches 61

Although the number k of the redundant switches 61 connecting one pixel signal line vsl and a redundant wiring vsl, and of the drive signal lines drl is an integer of 2 or more, the number k can be determined as appropriate in consideration of a required specification of the solid-state imaging device, which is for example a degree of decrease in read speed at a time of relief, and an effect on image quality.

Figures 12A, 12B, 12C:
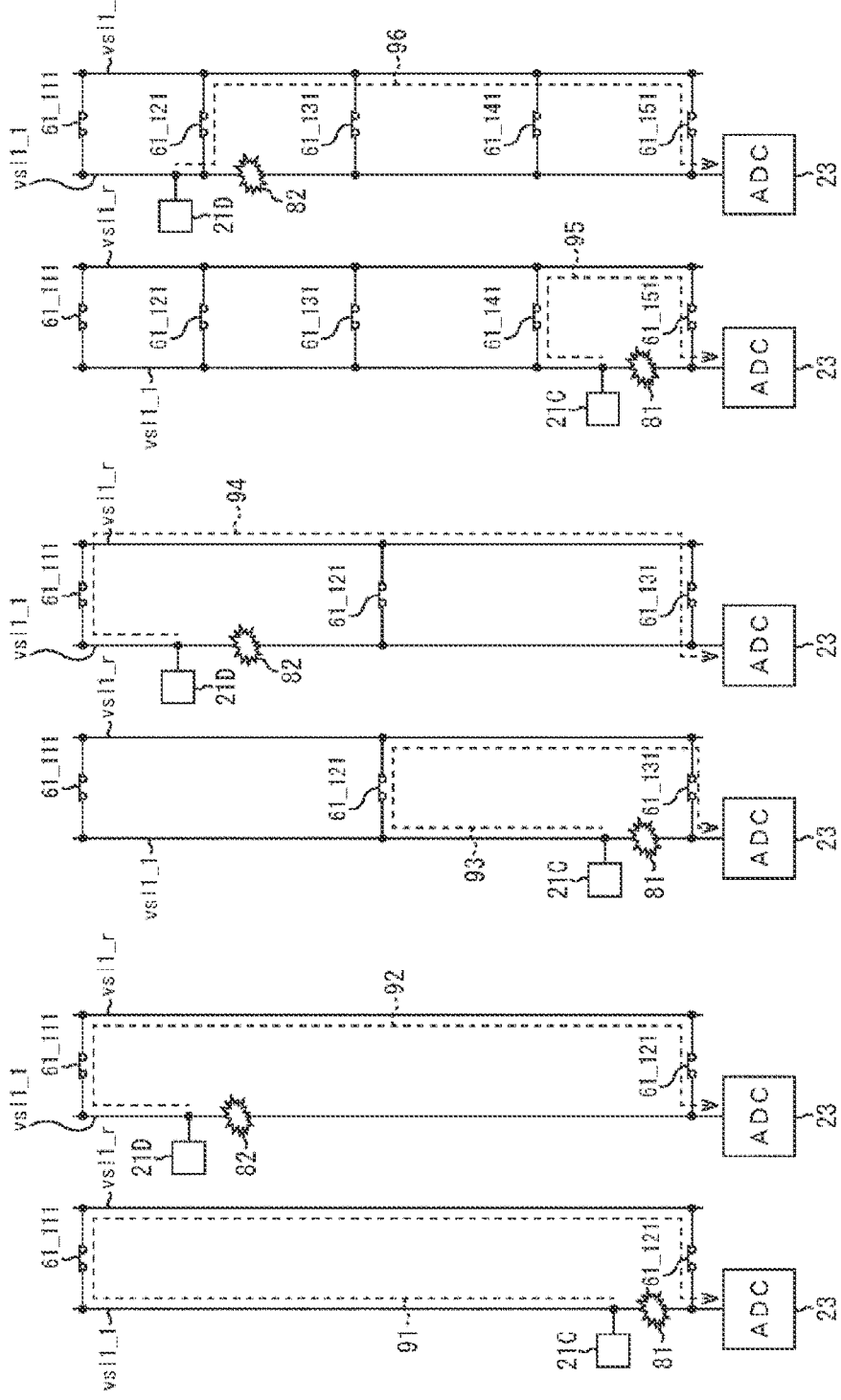
FIGS. 12A, 12B, and 12C are diagrams illustrating an example of a detour path.

FIGS. 12A, 12B, and 12C illustrate an example of a detour path of a case where a value of the number k of the redundant switches 61 between a pixel signal line vsl1_1 and a redundant wiring vsl1_r, and of the drive signal lines drl is changed.

FIGS. 12A, 12B, and 12C illustrate examples in which disconnection failure has occurred in the pixel signal line vsl1_1, FIGS. 12A, 12B, and 12C being an example of a case where a pixel signal of a pixel 21C near a location 81 at which a location of disconnection failure is close to an ADC 23 is transmitted, and an example of a case where a pixel signal of a pixel 21D near the location 82 at which a location of disconnection failure is far from the ADC 23 is transmitted.

FIG. 12A illustrates examples of a detour path of a case where the number k of the redundant switches 61 and of the drive signal lines drl is two.

In a case where the number of the redundant switches 61 and of the drive signal lines drl is two, a redundant switch 61_111 and a redundant switch 61_121 are arranged on both end sides of pixel columns.

A detour path for a pixel signal of the pixel 21C near the location 81 at which disconnection failure is close to the ADC 23 and a detour path for a pixel signal of the pixel 21D near the location 82 at which disconnection failure is far from the ADC 23 are both a path that runs through the redundant switch 61_111 and the redundant switch 61_121.

That is, the pixel signal of the pixel 21C is output to the ADC 23 through a detour path 91, and the pixel signal of the pixel 21D is output to the ADC 23 through a detour path 92. In the pixel 21C near the location 81 at which disconnection failure is close to the ADC 23, a pixel signal is supplied to the ADC 23 through a considerably long route, and therefore, lowering of read time is bigger.

FIG. 12B illustrates examples of a detour path of a case where the number k of the redundant switches 61 and of the drive signal lines drl is three.

In a case where the number of the redundant switches 61 and of the drive signal lines drl is three, a redundant switches 61_111 and 61_131 are arranged on both end sides of the pixel columns, and the redundant switch 61_121 is arranged at a central part of the pixel columns.

A detour path 94 for a pixel signal of the pixel 21D near the location 82 at which disconnection failure is far from the ADC 23 is similar to the detour path 92 in A of FIGS. 12A, 12B, and 12C.

Meanwhile, a detour path 93 for a pixel signal of the pixel 21C near the location 81 at which disconnection failure is close to the ADC 23 is a path that runs through the redundant switch 61_121 and a redundant switch 61_131, by which lowering of read time can be reduced as compared to the detour path 91 in FIG. 12A.

FIG. 12C illustrates examples of a detour path of a case where the number k of the redundant switches 61 and of the drive signal lines drl is five.

In a case where the number of the redundant switches 61 and of the drive signal lines drl is five, a redundant switches 61_111 and 61_151 are arranged on both end sides of the pixel columns, and the redundant switches 61_121 to 61_141 are arranged inside the pixel columns at equal intervals.

A detour path 95 for a pixel signal of the pixel 21C near the location 81 at which disconnection failure is close to the ADC 23 is a path that runs through the redundant switch 61_141 and the redundant switch 61_151, by which lowering of read time can be further reduced as compared to the detour path 93 in FIG. 12B.

A detour path 96 for a pixel signal of the pixel 21C near the location 82 at which disconnection failure is far from the ADC 23 is a path that runs through the redundant switch 61_121 and the redundant switch 61_151, by which lowering of read time can be further reduced as compared to the detour paths 92 and 94 in FIGS. 12A and 12B.

Thus, the more detour paths are provided by increasing the number k of the redundant switches 61 connecting one pixel signal line vsl and a redundant wiring vsl, and of the drive signal lines drl, the more lowering of read time can be reduced, while arrangement density of the redundant switches 61 and the drive signal lines drl is increased. Therefore, the number of k needs to be determined in consideration of a required specification of the solid-state imaging device, which is for example a degree of decrease in read speed at a time of relief, and an effect on image quality.

Note that the fourth example of arrangement of the redundant switches 61 illustrated in FIG. 11 is limited to the detour path illustrated in-A of FIG. 12A. The first to third examples of arrangement of the redundant switches 61 in FIGS. 8 to 10 can implement the detour paths illustrated in-B and C of FIGS. 12B and 12C.

Example of Arrangement of Constant Current Source Circuit

Figure 13:
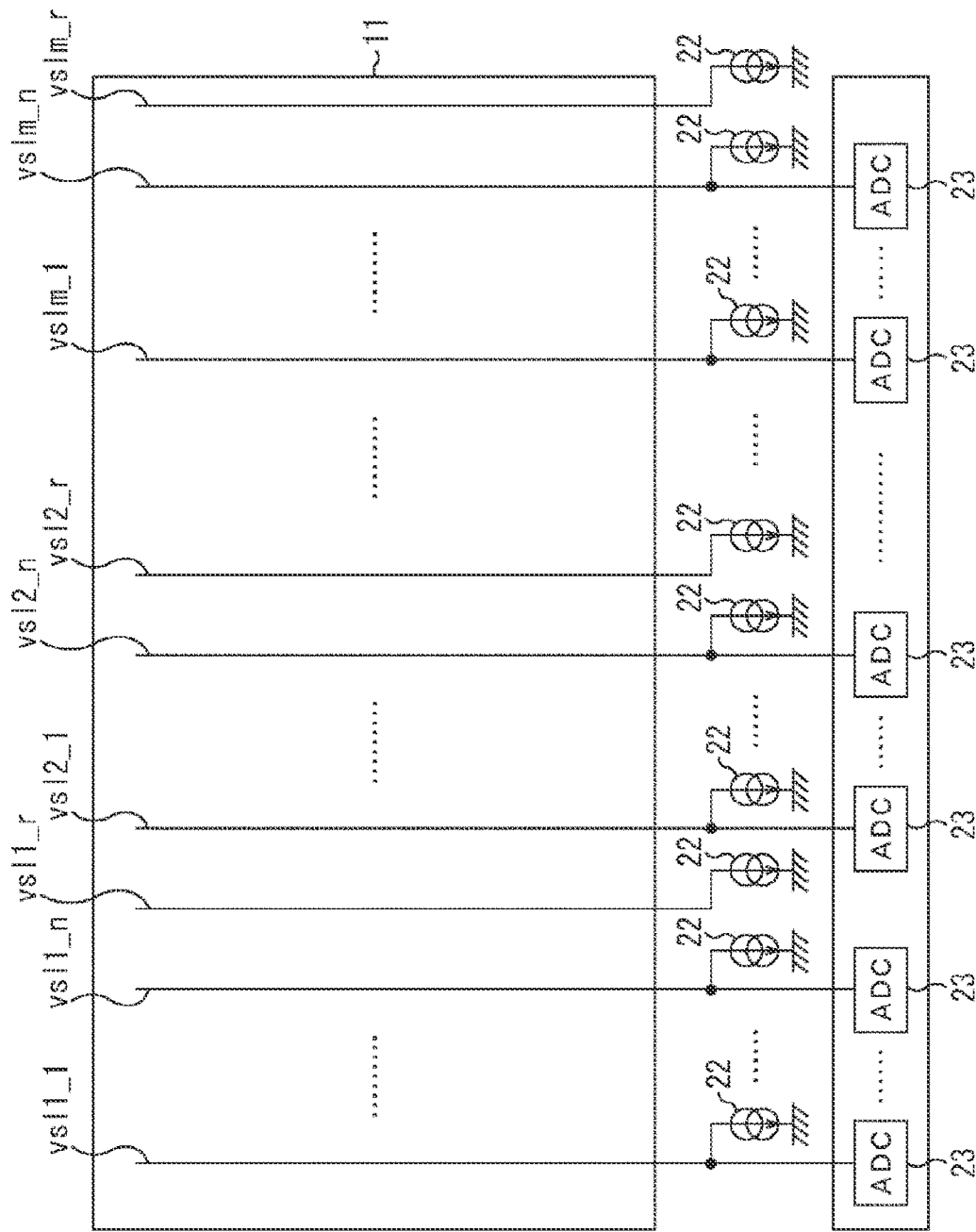
FIG. 13 is a diagram illustrating an example of arrangement of a constant current source circuit.

In a case where a detour path is used by using a redundant wiring vsl, capacitive load of the redundant wiring vsl is increased, and therefore, load capacitance is large being about twice as compared to a case where a redundant wirings vsl is not used. Therefore, as illustrated in FIG. 13, a constant current source circuit 22 can be provided in redundant wiring vsl as similar to a pixel signal line vsl. That is, a configuration may be employed in which a constant current source circuit 22 is connected to each of the pixel signal line vsl and the redundant wiring vsl. By connecting a constant current source circuit 22 to a redundant wiring vsl, charging/discharging capacity can be enhanced and an increase (delay) in read time can be reduced.

4. Configuration Example of Entire Solid-State Imaging Device

Figure 14:
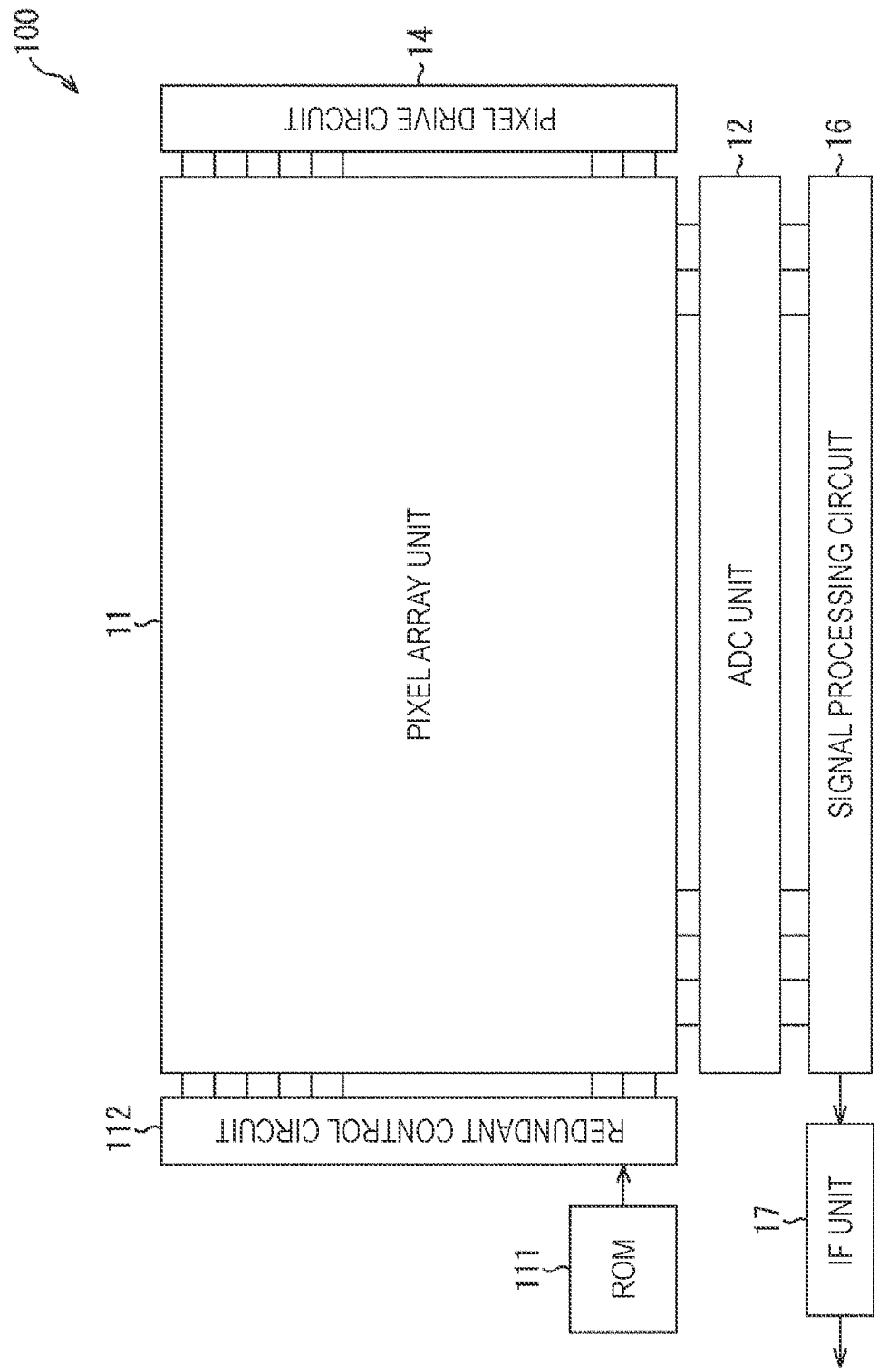
FIG. 14 is a block diagram illustrating a configuration example of a solid-state imaging device to which the present technology is applied.

FIG. 14 is a block diagram illustrating a configuration example of a solid-state imaging device to which the present technology is applied, the solid-state imaging device including the first redundant circuit described with reference to FIGS. 4, 5, 6, 7, 8, 9, 10, 11, 12A, 12B, 12C, and 13.

As similar to the solid-state imaging device 1 in FIG. 1, a solid-state imaging device 100 in FIG. 14 has a pixel array unit 11, an ADC unit 12, a timing control unit 13, a pixel drive circuit 14, a reference signal generation unit 15, a signal processing circuit 16, and an IF unit 17. Note that illustration of a timing control unit 13 and a reference signal generation unit 15 is omitted in FIG. 14.

Furthermore, the solid-state imaging device 100 further includes a read only memory (ROM) 111 as a storage unit and a redundant control circuit 112 as compared to the solid-state imaging device 1 in FIG. 1.

In other words, the solid-state imaging device 100 has a configuration similar to a configuration of the solid-state imaging device 1 in FIG. 1, the configuration being described with reference to FIGS. 4, 5, 6, 7, 8, 9, 10, 11, 12A, 12B, 12C, and 13, except that the solid-state imaging device 100 includes the ROM 111 and the redundant control circuit 112.

The ROM 111 stores a point of wiring failure detected in a pre-shipment inspection of the solid-state imaging device 100 and recovery information for relieving the wiring failure. Specifically, due to a point of wiring failure, which redundant switch 61 should be turned on in a case where a pixel signal of which pixel 21 is output to an ADC 23 is stored as recovery information. Generation of recovery information will be described later with reference to FIG. 23.

The redundant control circuit 112 reads recovery information stored in the ROM 111 and drives a predetermined redundant switch 61 in the pixel array unit 11 on the basis of the recovery information. That is, the redundant control circuit 112 turns on the predetermined redundant switch 61 at a predetermined timing on the basis of the recovery information. The redundant control circuit 112 may be incorporated and configured as a part of the pixel drive circuit 14.

The signal processing circuit 16 can execute signal correction processing for correcting a pixel 21 (hereinafter, referred to as a defect correction target pixel) that has a point defect or reduced sensitivity. For example, the signal processing circuit 16 performs correction by using a pixel value of a pixel 21 adjacent to the defect correction target pixel, or performs processing of multiplying by a coefficient so that so as to have sensitivity similar to sensitivity of the pixel 21 adjacent to the defect correction target pixel.

5. Application to Drive Signal Line

Although, in the above-described example, there has been described an example in which redundant pixel signal lines vsl (redundant wirings vsl) are provided to relieve disconnection failure of a pixel signal line vsl that transmits a pixel signal, a drive signal line hsl, which transmits a drive signal that is supplied from the pixel drive circuit 14 to a pixel circuit of each of the pixels 21, can also be applied similarly. That is, in order to relieve disconnection failure of a drive signal line hsl, it is possible to provide one redundant drive signal line hsl (redundant wiring hsl) for n number of drive signal lines hsl, and provide one or more redundant switches 61 between the one redundant wiring hsl and each of the n number of drive signal lines hsl, the one or more redundant switches 61 connecting the one redundant wiring hsl and each of the n number of drive signal lines hsl. With this arrangement, redundant circuit overhead is reduced, and disconnection failure of the drive signal line hsl is relieved. That is, it is possible to relieve wiring failure with less redundancy.

6. Configuration Example of Second Redundant Circuit

Next, a configuration of a second redundant circuit will be described.

Figure 15:
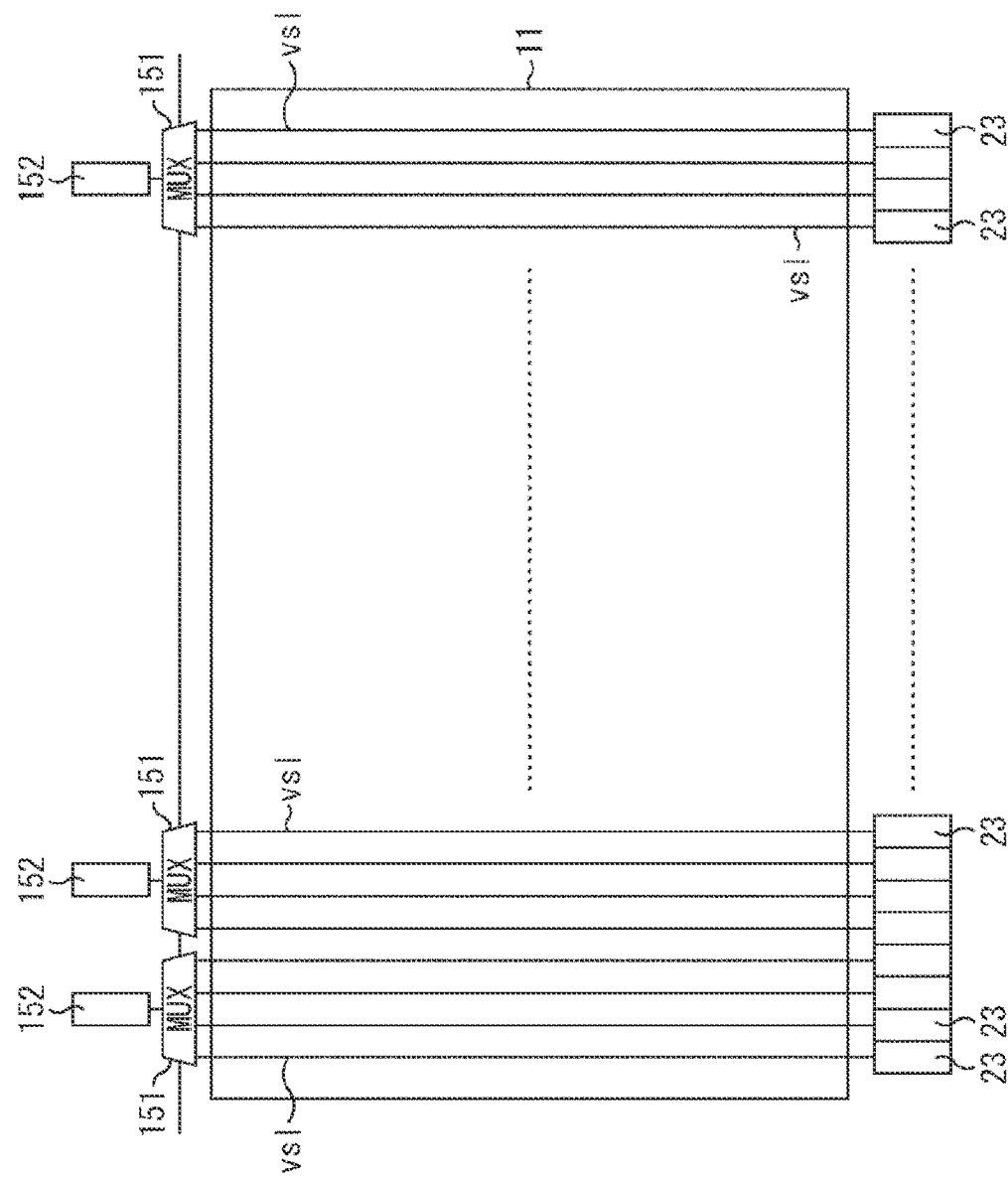
FIG. 15 is a conceptual diagram of a second redundant circuit having a circuit configuration to which the present technology is applied.

FIG. 15 is a conceptual diagram of the second redundant circuit having a circuit configuration to which the present technology is applied.

In a circuit in FIG. 15, ADCs 23 and pixel signal lines vsl are provided on a one-to-one basis at one end of the pixel signal lines vsl in the pixel array unit 11, which is lower side arranged in the figure (hereinafter referred to as a south side) in the figure, and one multiplexer (MUX) 151 and one ADC 152 (hereinafter referred to as a redundant ADC 152) are provided for each of a plurality of pixel signal lines vsl at an opposite side of the south side of the pixel signal lines vsl (hereinafter referred to as a north side).

In the basic configuration of the solid-state imaging device illustrated in FIG. 1, ADCs 23 and pixel signal lines vsl are provided on a one-to-one basis. Therefore, in other words, the circuit in FIG. 15 has a configuration in which a plurality of pixel signal lines vsl is grouped together, and one MUX 151 and one redundant ADC 152 are redundantly provided for each group. In the example in FIG. 15, one group includes four pixel signal lines vsl, and one MUX 151 and one redundant ADC 152 are provided for each the four pixel signal lines vsl. One MUX 151 and one redundant ADC 152 are redundant circuits that relieve a disconnection failure of the four pixel signal lines vsl connected to the MUX 151 and redundant ADC 152.

Figure 16:
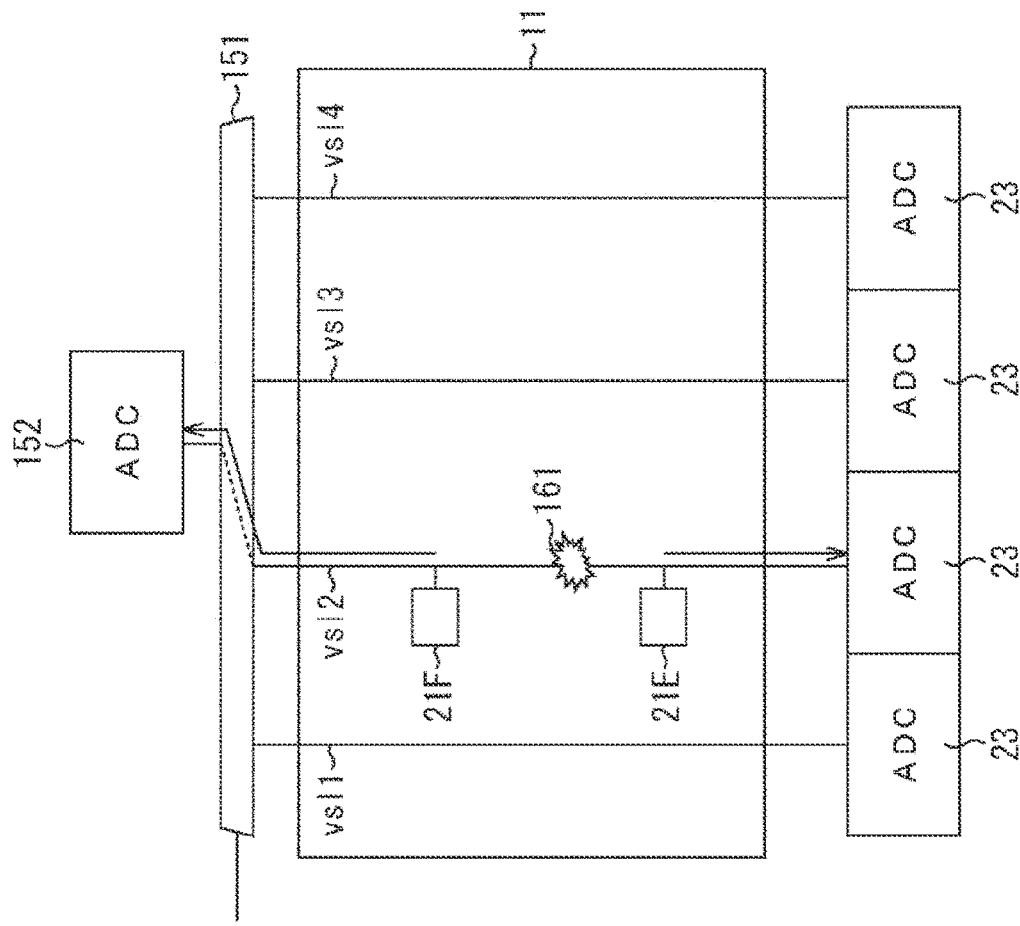
FIG. 16 is a diagram illustrating a configuration example of one group of pixel signal lines and ADCs.

FIG. 16 illustrates a configuration example of one group of the pixel signal lines and ADCs.

The MUX 151 is a selection unit that selects one of the four pixel signal lines vsl, and connects a selected predetermined one pixel signal line vsl to the redundant ADC 152. Here, the perspective four pixel signal lines vsl connected to one MUX 151 are distinguished as pixel signal lines vsl1 to vsl4. The redundant ADC 152 is configured in a similar manner to an ADC 23.

In a case where disconnection failure does not occur in the four pixel signal lines vsl1 to vsl4 connected to one MUX 151, pixel signals of the pixels 21 connected to the respective four pixel signal lines vsl1 to vsl4 are supplied to an ADC 23 connected to any of the pixel signal lines vsl1 to vsl4 and subjected to A-D conversion.

Meanwhile, for example, as illustrated in FIG. 16, it is assumed that disconnection has occurred in a predetermined point 161 (hereinafter, referred to as a disconnected point 161) of a pixel signal line vsl2. In this case, of a plurality of pixels 21 connected to the pixel signal line vsl2, a pixel signal of a pixel 21 between the disconnected point 161 and the ADC 23 (for example, a pixel 21E) can be output to the ADC 23, but a pixel signal of a pixel 21 on the north side of the disconnected point 161 (for example, a pixel 21F) cannot be output to the ADC 23.

Therefore, the MUX 151 selects the pixel signal line vsl2 from among the four pixel signal lines vsl1 to vsl4, and connects the selected pixel signal line vsl2 and the redundant ADC 152. With this arrangement, a pixel signal of a pixel 21 on the north side of the disconnected point 161 (for example, the pixel 21F) can be output to the redundant ADC 152, and A-D conversion can be performed in the redundant ADC 152. As a result, it is possible to acquire pixel signals of all the pixels 21 connected to the four pixel signal lines vsl1 to vsl4 that constitute one group.

Figure 17:
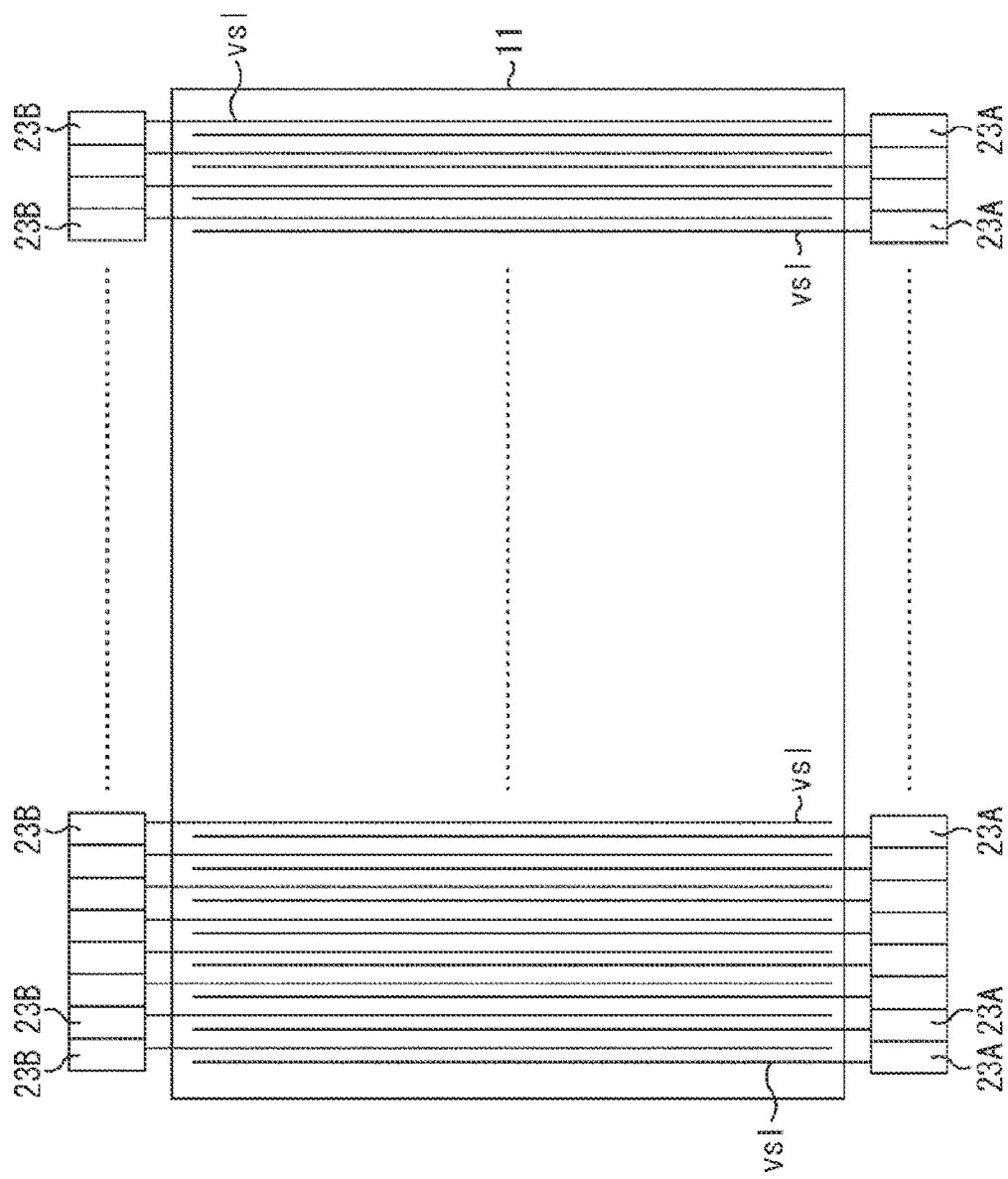
FIG. 17 is a diagram illustrating an example of arrangement of ADCs of a basic configuration example of a solid-state imaging device different from the example of the basic configuration in FIG. 1.

Note that, there is also a configuration in which two ADCs 23 are provided for one pixel column in a solid-state imaging device capable of high-speed reading of a pixel signal, as illustrated in FIG. 17.

That is, FIG. 17 illustrates an example of arrangement of ADCs of a basic configuration example of a solid-state imaging device different from the example of the basic configuration in FIG. 1.

In FIG. 17, two pixel signal lines vsl are provided for one pixel column, and ADCs 23 are arranged on each of the south side and the north side. In the following, an ADC 23 connected to the south side of a pixel signal line vsl will be referred to as an ADC 23A, and an ADC 23 connected to the north side of a pixel signal line vsl will be referred to as an ADC 23B By using two pixel signal lines vsl provided on one pixel column, for example, a pixel signal of each of the pixels 21 in a south half from a midpoint in a north-south direction is supplied to an ADC 23A on the south side for A-D conversion, and a pixel signal of each of the pixels 21 in a north half is supplied to an ADC 23B on the north side for A-D conversion, by which high-speed reading of a pixel signal is possible.

Figure 18:
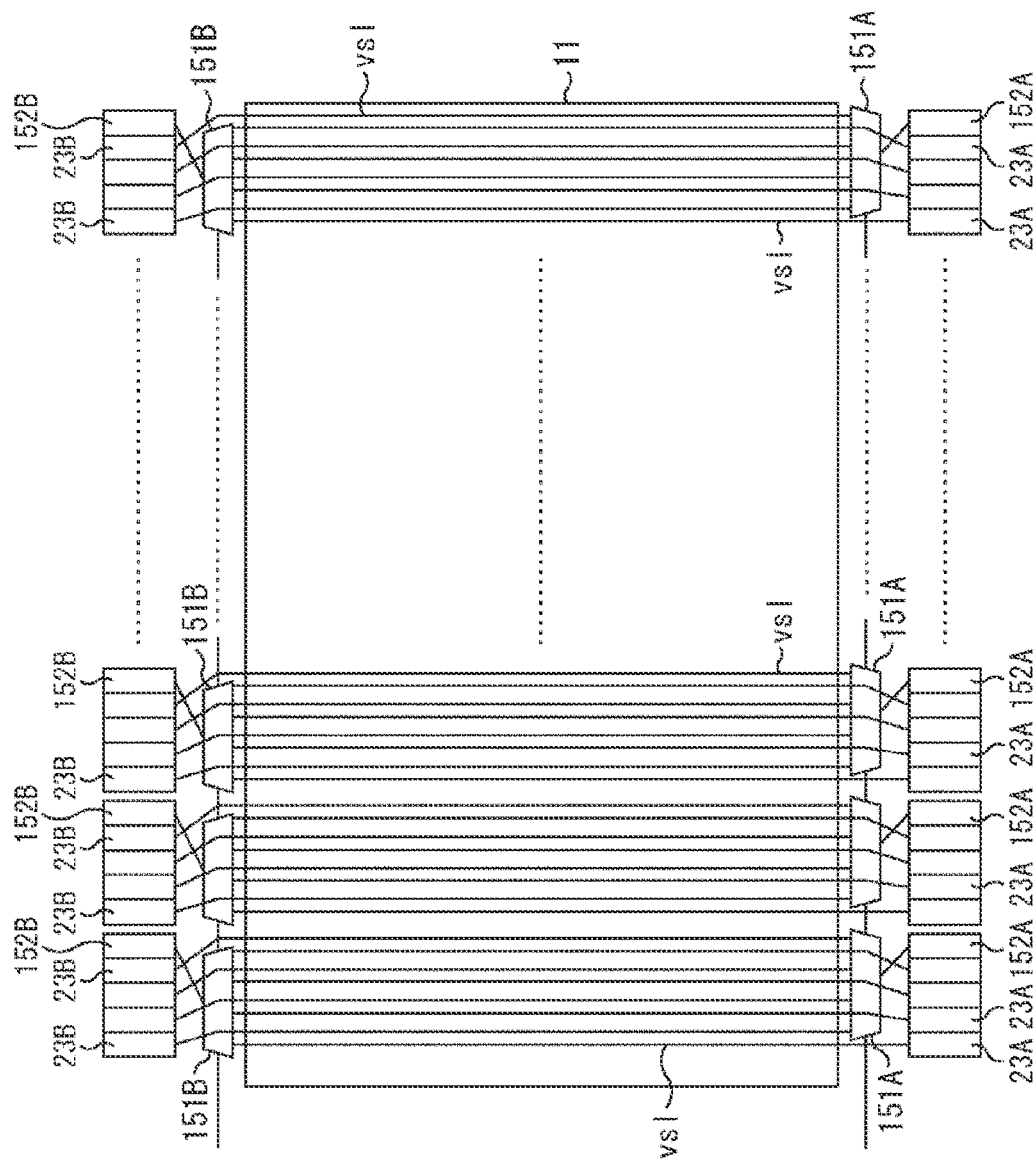
FIG. 18 is a conceptual diagram of a second redundant circuit having a circuit configuration to which the present technology is applied.

FIG. 18 is a conceptual diagram in which a second redundant circuit is applied to a basic configuration in which two ADCs 23 (ADC 23A and ADC 23B) are arranged in the north-south direction for one pixel column as illustrated in FIG. 17.

In FIG. 18, one MUX 151A and one redundant ADC 152A are redundantly provided for four ADCs 23A arranged on the south side of the pixel signal lines vsl, and one MUX 151B and one redundant ADC 152B are redundantly provided for four ADCs 23B arranged on the north side of the pixel signal lines vsl In other words, for each of the ADCs 23 on the north side and south side, four pixel columns are grouped together, and one MUX 151 and one redundant ADC 152 are provided for each group.

Figure 19:
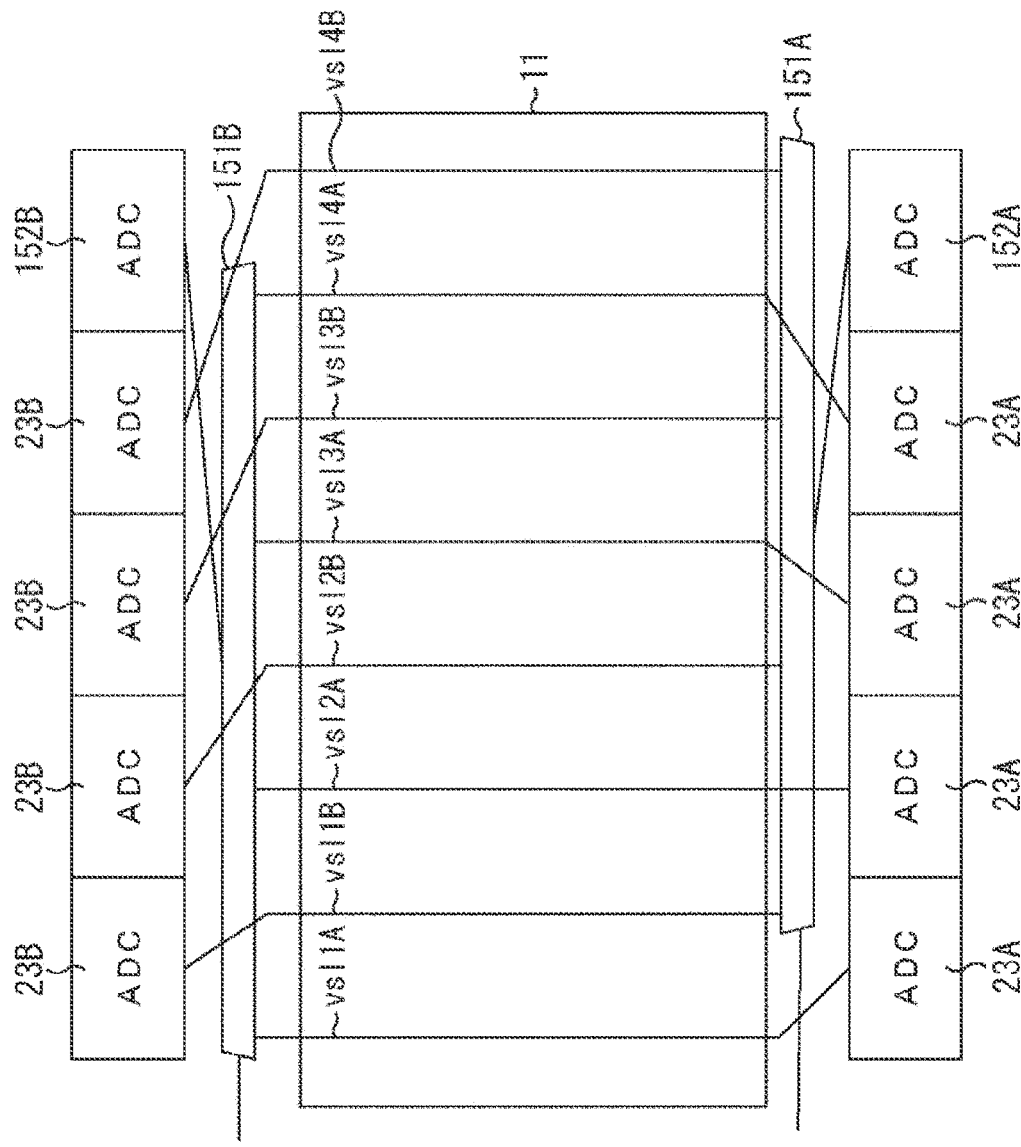
FIG. 19 is a diagram illustrating a configuration example of one group of pixel signal lines and ADCs.

FIG. 19 illustrates a configuration example of one group of the pixel signal lines and ADCs.

In FIG. 19, four pixel signal lines vsl connected to four ADCs 23A on the south side are distinguished as pixel signal lines vsl1A to vsl4A, and four pixel signal lines vsl connected to four ADCs 23B on the north side are distinguished as pixel signal lines vsl1B to vsl4B.

An MUX 151A provided on the south side selects any of the four pixel signal lines vsl1B to vsl4B, and connects any of the pixel signal lines vsl1B to vsl4B that is selected and a redundant ADC 152A. An MUX 151B provided on the north side selects any of the four pixel signal lines vsl1A to vsl4A, and connects any of the pixel signal lines vsl1A to vsl4A that is selected and a redundant ADC 152B. A redundant ADC 152A and 152B are configured in a similar manner to an ADC 23 (23A, 23B).

In a case where no disconnection has occurred in any of the four pixel signal lines vsl1A to vsl4A and four pixel signal lines vsl1B to vsl4B, a pixel signal of each of the pixels 21 in the south half from the midpoint in the north-south direction of each of the pixel columns is supplied to an ADC 23A on the south side for A-D conversion, by using any of the pixel signal lines vsl1A to vsl4A to which the pixel 21 is connected. Furthermore, a pixel signal of each of the pixels 21 in the north half from the midpoint in the north-south direction of each of the pixel columns is supplied to an ADC 23B on the north side for A-D conversion, by using any of the pixel signal lines vsl1B to vsl4B to which the pixel 21 is connected.

Figure 20:
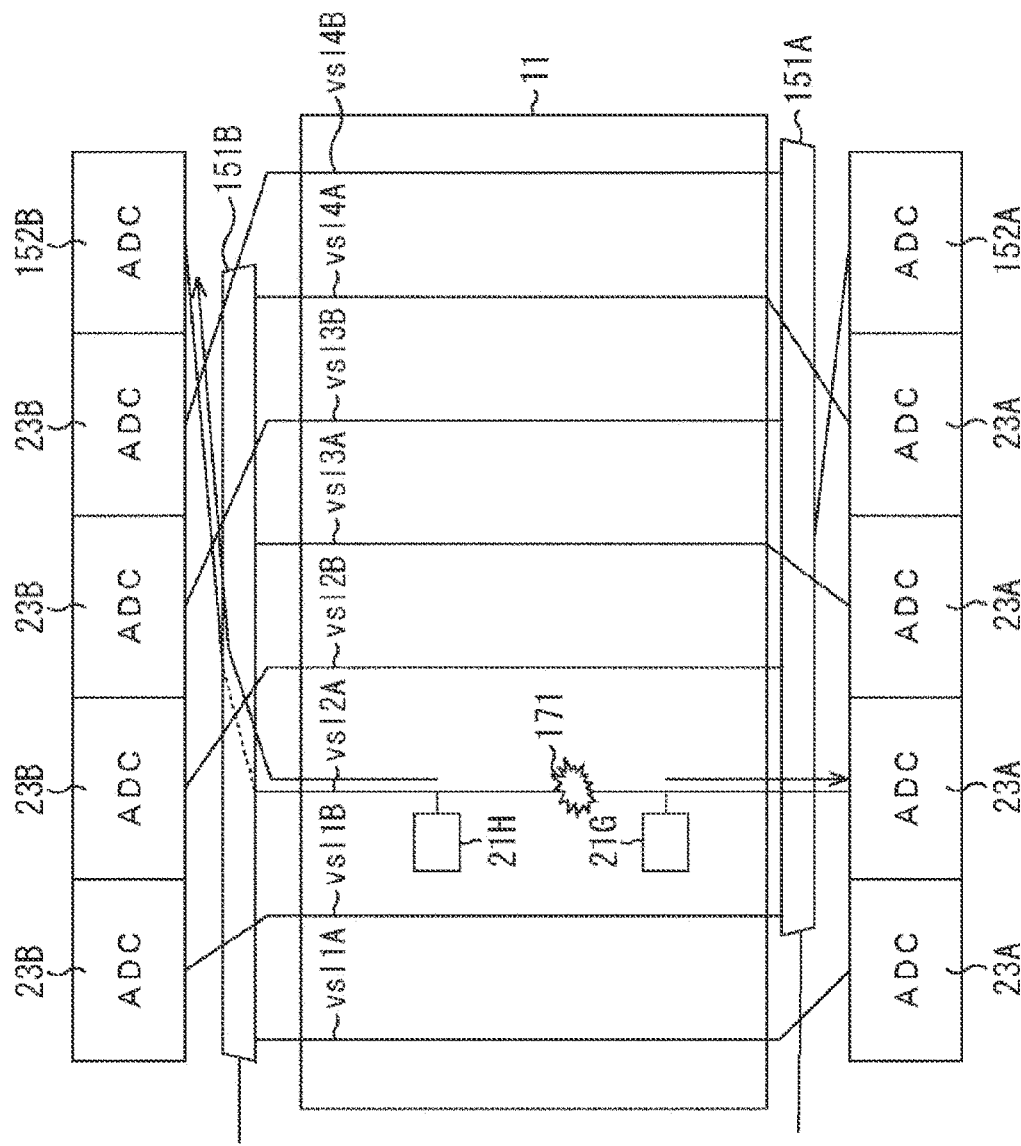
FIG. 20 is a diagram describing a control example of a case where disconnection failure has occurred.

FIG. 20 illustrates a control example of a case where disconnection failure has occurred in a pixel signal line vsl through which a pixel signal is transmitted to an ADC 23A on the south side.

For example, as illustrated in FIG. 20, it is assumed that disconnection has occurred in a predetermined point 171 (hereinafter, referred to as a disconnected point 171) of the pixel signal line vsl2A. In this case, of a plurality of pixels 21 connected to the pixel signal line vsl2A, a pixel signal of a pixel 21 between the disconnected point 171 and the ADC 23A (for example, a pixel 21G) can be output to the ADC 23A on the south side, but a pixel signal of a pixel 21 on the north side of the disconnected point 171 (for example, a pixel 21F) cannot be output to the ADC 23A on the south side.

Therefore, the MUX 151B on the north side selects the pixel signal line vsl2A from among the four pixel signal lines vsl1A to vsl4A, and connects the selected pixel signal line vsl2A and the redundant ADC 152B. With this arrangement, a pixel signal of a pixel 21 on the north side of the disconnected point 171 (for example, the pixel 21H) can be output to the redundant ADC 152B, and A-D conversion can be performed in the redundant ADC 152B. As a result, it possible to acquire pixel signals of all the pixels 21 of the four pixel columns that constitute one group.

Figure 21:
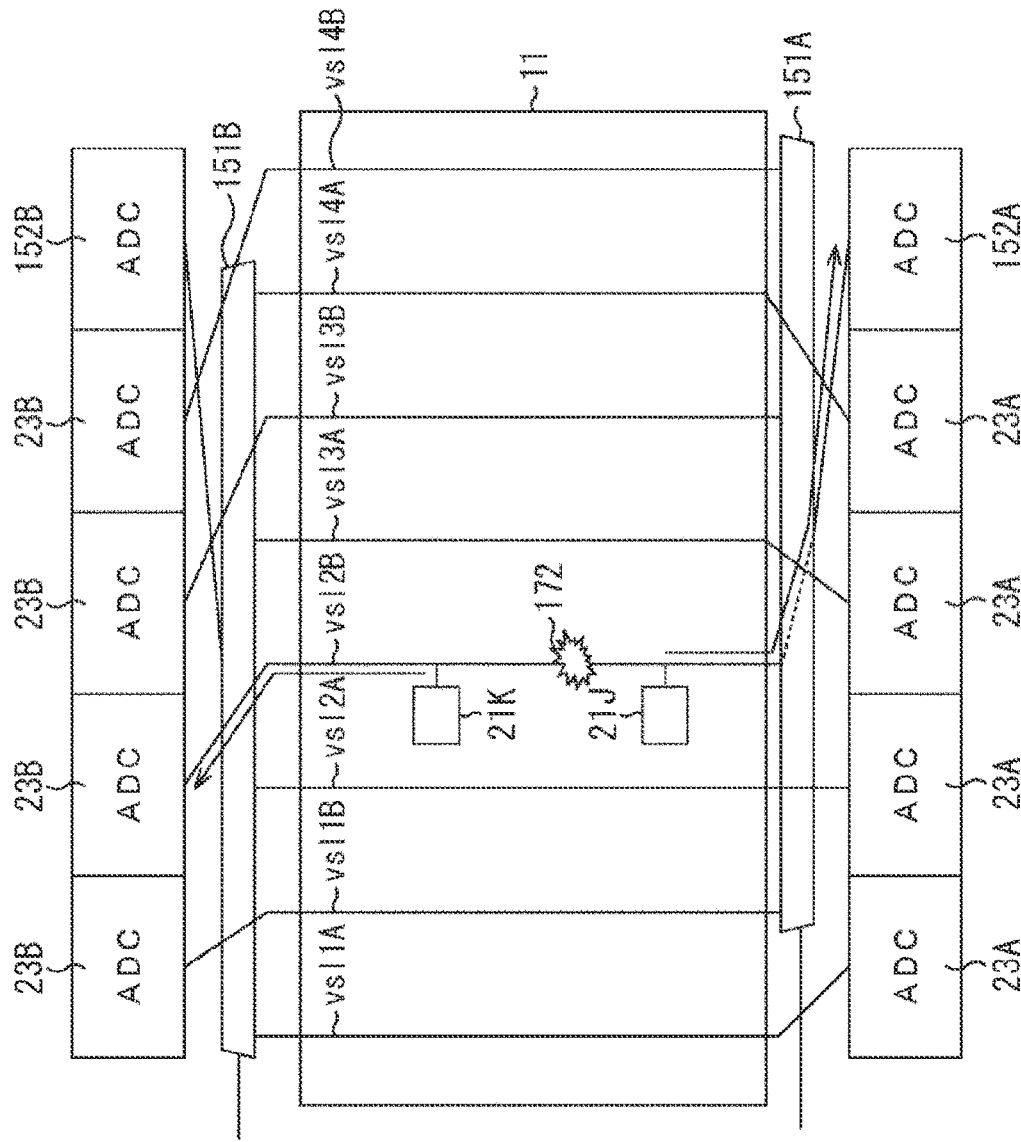
FIG. 21 is a diagram describing a control example of a case where disconnection failure has occurred.

FIG. 21 illustrates a control example of a case where disconnection failure has occurred in a pixel signal line vsl through which a pixel signal is transmitted to an ADC 23B on the north side.

For example, as illustrated in FIG. 21, it is assumed that disconnection has occurred in a predetermined point 172 (hereinafter, referred to as a disconnected point 172) of the pixel signal line vsl2B. In this case, of a plurality of pixels 21 connected to the pixel signal line vsl2B, a pixel signal of a pixel 21 between the disconnected point 172 and the ADC 23B (for example, a pixel 21K) can be output to the ADC 23B on the north side, but a pixel signal of a pixel 21 on the south side of the disconnected point 172 (for example, a pixel 21J) cannot be output to the ADC 23B on the north side.

Therefore, the MUX 151A on the south side selects the pixel signal line vsl2B from among the four pixel signal lines vsl1B to vsl4B, and connects the selected pixel signal line vsl2B and the redundant ADC 152A. With this arrangement, a pixel signal of a pixel 21 on the south side of the disconnected point 172 (for example, the pixel 21J) can be output to the redundant ADC 152B, and A-D conversion can be performed in the redundant ADC 152B. As a result, it is possible to acquire pixel signals of all the pixels 21 of the four pixel columns that constitute one group.

Therefore, with the second redundant circuit to which the present technology is applied, it is possible to relieve wiring failure with less redundancy.

7. Configuration Example of Entire Solid-State Imaging Device

Figure 22:
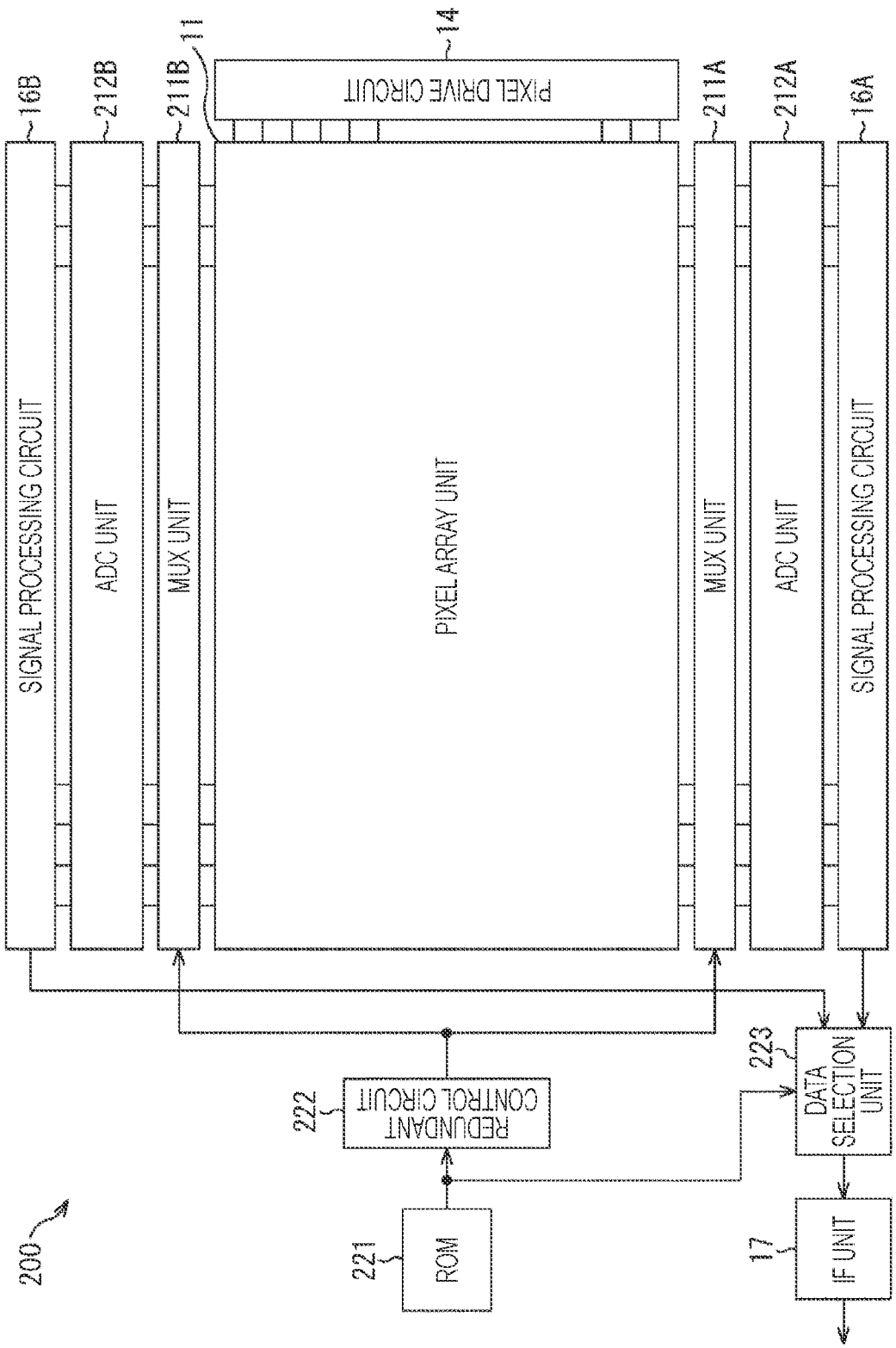
FIG. 22 is a block diagram illustrating a configuration example of a solid-state imaging device to which the present technology is applied.

FIG. 22 is a block diagram illustrating a configuration example of a solid-state imaging device to which the present technology is applied, the solid-state imaging device including the second redundant circuit described with reference to FIGS. 18 to 21.

As similar to FIG. 1, a solid-state imaging device 200 in FIG. 22 has a pixel array unit 11 in which a plurality of pixels 21 is arranged in a matrix, and a pixel drive circuit 14 for driving each of the pixels 21. The pixel array unit 11 is provided with two pixel signal lines vsl for one pixel column as illustrated in FIG. 18, for example.

An MUX unit 211, an ADC unit 212, and a signal processing circuit 16 are arranged on each of the south side and north side of the pixel array unit 11. Specifically, an MUX unit 211A, an ADC unit 212A, and a signal processing circuit 16A are arranged on the south side of the pixel array unit 11, and an MUX unit 211B, an ADC unit 212B, and a signal processing circuit 16B are arranged on the north side of the pixel array unit 11.

The MUX unit 211A on the south side includes, for example, a plurality of MUXes 151A illustrated in FIG. 18. The ADC unit 212A on the south side includes, for example, a plurality of ADCs 23A and a plurality of redundant ADCs 152A illustrated in FIG. 18.

The signal processing circuit 16A performs various digital signal processing on A-D converted pixel data output from the ADC 23A or redundant ADC 152A included in the ADC unit 212A.

The MUX unit 211B on the north side includes, for example, a plurality of MUXes 151B illustrated in FIG. 18. The ADC unit 212B on the north side includes, for example, a plurality of ADCs 23B and a plurality of redundant ADCs 152B illustrated in FIG. 18.

The signal processing circuit 16B performs various digital signal processing on A-D converted pixel data output from the ADC 23B or redundant ADC 152B included in the ADC unit 212B.

The solid-state imaging device 200 in FIG. 22 further has a ROM 221, a redundant control circuit 222, a data selection unit 223, and an IF unit 17.

The ROM 221 stores a point of wiring failure detected in a pre-shipment inspection of the solid-state imaging device 200 and recovery information for relieving the wiring failure. Specifically, stored as recovery information are, due to a point of wiring failure, information indicating, in each of the MUXes 151A in the MUX unit 211A, which of the four pixel signal lines vsl1B to vsl4B should be connected to the redundant ADC 152A, and information indicating, in each of the MUXes 151B in the MUX unit 211B, which of the four pixel signal lines vsl1A to vsl4A should be connected to the redundant ADC 152B. Recovery information stored in the ROM 221 is supplied to the redundant control circuit 222 and the data selection unit 223. Generation of recovery information will be described later with reference to FIG. 23.

The redundant control circuit 222 reads recovery information stored in the ROM 221 and controls each of the MUXes 151A in the MUX unit 211A and each of the MUXes 151B in the MUX unit 211B on the basis of the recovery information.

The data selection unit 223 selects either pixel data supplied from the signal processing circuit 16A or pixel data supplied from the signal processing circuit 16B on the basis of recovery information acquired from the ROM 221 and outputs the selected pixel data to the IF unit 17.

For example, as illustrated in FIG. 19, in a case where no disconnection has occurred in any of the four pixel signal lines vsl1A to vsl4A and four pixel signal lines vsl1B to vsl4B, the data selection unit 223 selects pixel data supplied from the signal processing circuit 16A for a pixel signal of each of the pixels 21 in the south half from the midpoint in the north-south direction of each of the pixel columns, and selects pixel data supplied from the signal processing circuit 16B for a pixel signal of each of the pixels 21 in the north half.

Furthermore, for example, as illustrated in FIG. 20, in a case where disconnection has occurred in the disconnected point 171 on one pixel signal line vsl2A, the data selection unit 223 selects pixel data that has been subjected to A-D conversion in the ADC 23A and supplied from the signal processing circuit 16A for pixel data of a pixel 21 between the disconnected point 171 and the ADC 23A (for example, the pixel 21G), or selects pixel data that has been subjected to A-D conversion in the redundant ADC 152B and supplied from the signal processing circuit 16B for pixel data of a pixel 21 on the north side of the disconnected point 171 (for example, the pixel 21H).

Furthermore, for example, as illustrated in FIG. 21, in a case where disconnection has occurred in the disconnected point 172 on one pixel signal line vsl2B, the data selection unit 223 selects pixel data that has been subjected to A-D conversion in the ADC 23B and supplied from the signal processing circuit 16B for pixel data of a pixel 21 between the disconnected point 172 and the ADC 23B (for example, the pixel 21K), or selects pixel data that has been subjected to A-D conversion in the redundant ADC 152A and supplied from the signal processing circuit 16A for pixel data of a pixel 21 on the south side of the disconnected point 172 (for example, the pixel 21J).

Therefore, in a case where disconnection has occurred in a predetermined pixel signal line vsl, the data selection unit 223 selects output data of either the ADC 23 or the redundant ADC 152, the ADC 23 and the redundant ADC 152 being connected to the pixel signal line vsl in which the disconnection has occurred.

The IF unit 17 outputs the pixel data supplied from the data selection unit 223 to outside of the device.

Note that illustration of a timing control unit 13 and a reference signal generation unit 15 is omitted in FIG. 22.

Although the solid-state imaging device 200 in FIG. 22 has an overall device configuration corresponding to the configuration illustrated in FIG. 18, the overall device configuration corresponding to the configuration illustrated in FIG. 15 can be implemented with a configuration in which the MUX unit 211A in the solid-state imaging device 200 in FIG. 22 is omitted.

Specifically, the ADC unit 212A on the south side includes the plurality of ADCs 23 illustrated in FIG. 15, and the signal processing circuit 16A performs various digital signal processing on A-D converted pixel data output from the plurality of ADCs 23. The MUX unit 211B on the north side includes the plurality of MUXes 151 in FIG. 15, and the ADC unit 212B includes the plurality of redundant ADCs 152B in FIG. 15. The signal processing circuit 16B performs various digital signal processing on A-D converted pixel data output from the plurality of redundant ADCs 152B. The data selection unit 223 selects either pixel data supplied from the signal processing circuit 16A or pixel data supplied from the signal processing circuit 16B on the basis of recovery information acquired from the ROM 221 and outputs the selected pixel data to the IF unit 17.

With the second redundant circuit described with reference to FIGS. 15 to 22, disconnection failure can be relieved by providing one MUX 151 and one redundant ADC 152 for each four pixel signal lines vsl, even in a case where the disconnection failure has occurred. In the second redundant circuit, in a case where the redundant ADC 152 is used, a reduction in read speed or reduction in image quality seen in the first redundant circuit does not occur.

Note that, although one redundant ADC 152 is provided for four pixel signal lines vsl in the above example, the number of pixel signal lines vsl for one redundant ADC 152 is not limited to four and can be determined arbitrarily.

Recovery information setting processing for setting recovery information and storing the recovery information in the ROM 221 will be described with reference to a flowchart in FIG. 23. The processing can be executed, for example, in a pre-shipment inspection in a manufacturing process for manufacturing the solid-state imaging device 200.

First, in step S11, the solid-state imaging device 200 captures an image of an inspection sample as a subject.

In step S12, an image processing device acquires the captured image output from the solid-state imaging device 200, and detects presence or absence of line defect failure in the captured image. In a case where there is line defect failure, a position of a pixel with the line defect failure is identified. In a case where it is judged that there is no line defect failure, the recovery information setting processing can be ended because it is not necessary to store the recovery information in ROM 221, and, in a case where it is judged that there is line defect failure, the next steps S13 to S17 are executed.

In step S13, the image processing device identifies a setting for an MUX 151 that may relieve the pixel 21 with the line defect failure.

In step S14, on the basis of a control signal from outside, the redundant control circuit 222 in the solid-state imaging device 200 sets the MUX 151 that may relieve the pixel 21 with the line defect failure.

In step S15, the solid-state imaging device 200 captures again an image of the inspection sample as a subject.

In step S16, the image processing device acquires the captured image output from the solid-state imaging device 200, and decides whether or not the line defect failure in the captured image has disappeared.

In a case where it is decided in step S16 that the line defect failure in the captured image has not yet disappeared, the processing is returned to step S13, and steps S13 to S16 described above are repeated.

Meanwhile, in a case where it is decided in step S16 that the line defect failure in the captured image has disappeared, the processing proceeds to step S17, and the solid-state imaging device 200 writes the recovery information to the ROM 221. That is, the solid-state imaging device 200 writes, as recovery information to the ROM 221, the position of the pixel affected by the line defect failure and setting information of the MUX 151 that relieves the pixel 21 with the line defect failure, and ends the recovery information setting processing.

Figure 24:
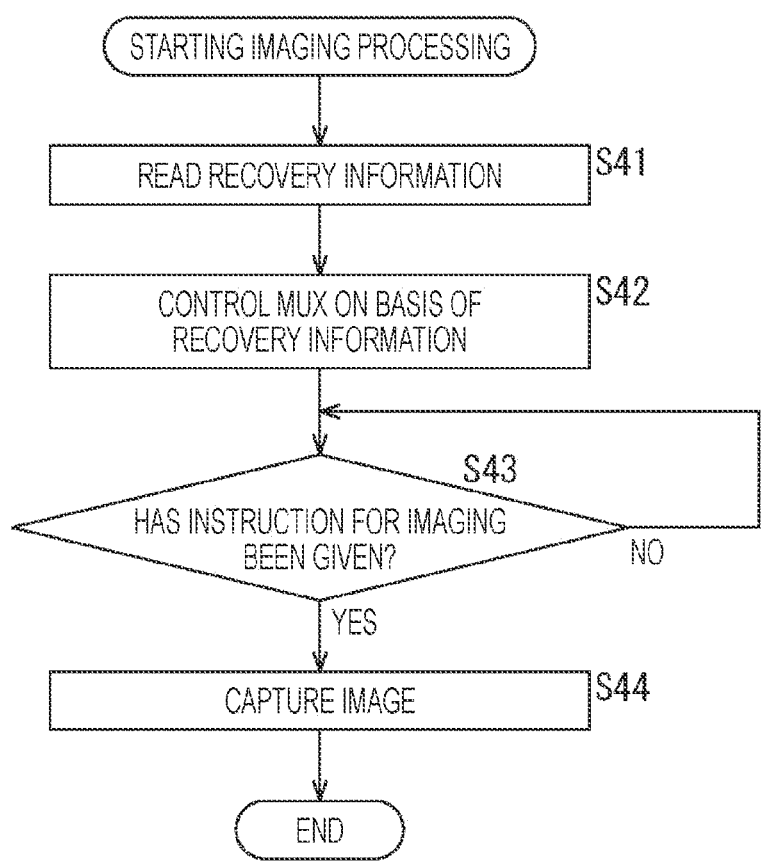
FIG. 24 is a flowchart describing imaging processing.

FIG. 24 is a flowchart of imaging processing in which imaging is performed by using recovery information stored in the ROM 221. The processing is executed, for example, when the solid-state imaging device 200 is turned on.

First, in step S41, the redundant control circuit 222 reads the recovery information stored in the ROM 221.

In step S42, the solid-state imaging device 200 controls each of the MUXes 151A in the MUX unit 211A and each of the MUXes 151B in the MUX unit 211B on the basis of the recovery information.

In step S43, the solid-state imaging device 200 decides whether or not an instruction for imaging has been given, and waits until it is decided that the instruction for imaging has been given.

In a case where it is decided in step S43 that the instruction for imaging has been given, the processing proceeds to step S44, and the solid-state imaging device 200 performs imaging to generate a captured image, and ends the imaging processing. By the imaging, a pixel signal generated in the pixel 21 is supplied to the ADC unit 212A or the ADC unit 212B. A pixel signal of a pixel 21 connected to the pixel signal line vsl with the wiring failure is supplied to the redundant ADC 152A in the ADC unit 212A or the redundant ADC 152B in the ADC unit 212B, and is subjected to A-D conversion. Then, in the signal processing circuit 16A or 16B, after predetermined signal processing is executed as necessary, the pixel signal is supplied to the data selection unit 223. The data selection unit 223 selects either pixel data supplied from the signal processing circuit 16A or pixel data supplied from the signal processing circuit 16B on the basis of recovery information acquired from the ROM 221 and outputs the selected pixel data to the IF unit 17. Then, the pixel data is output from the IF unit 17 to outside of the device.

Figure 23:
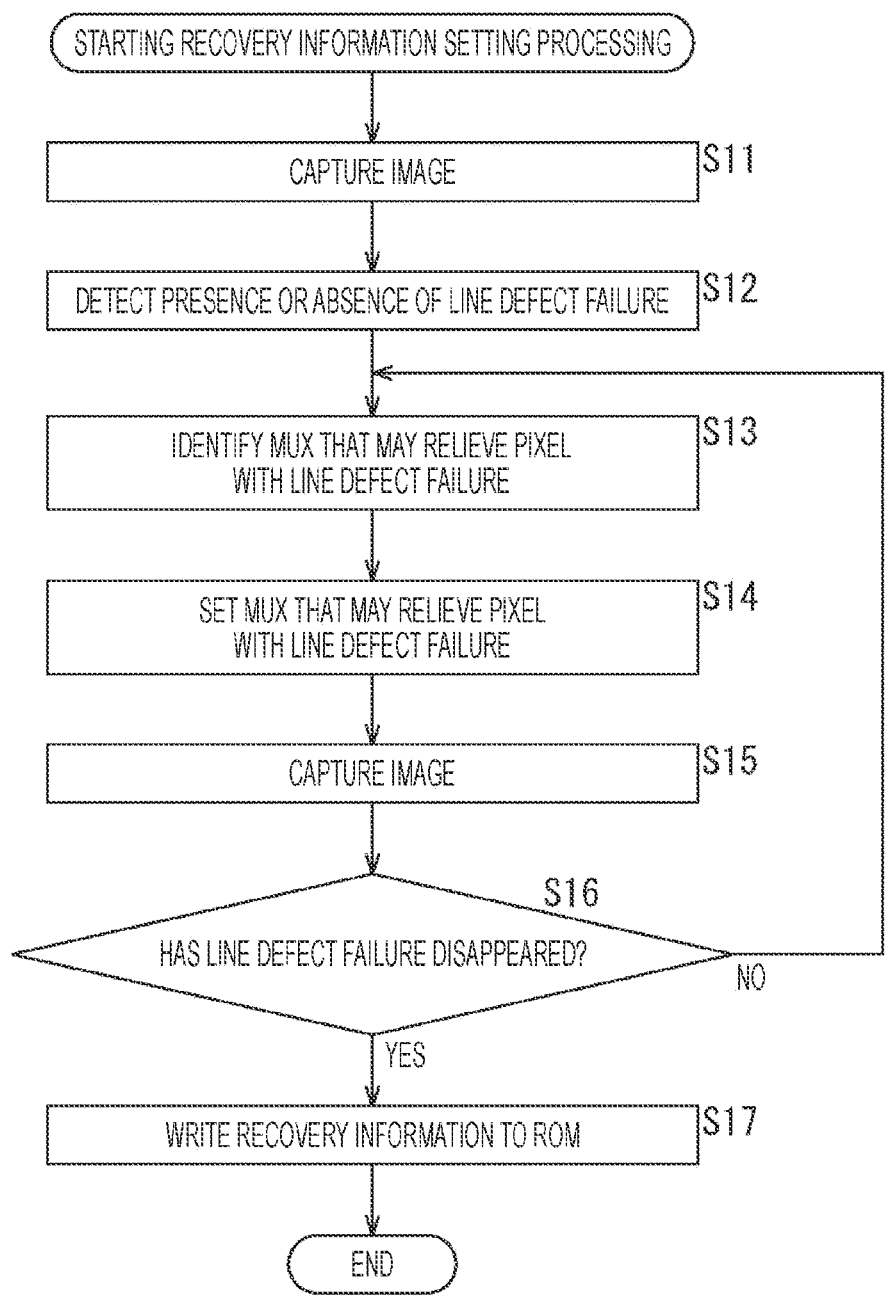
FIG. 23 is a flowchart describing recovery information setting processing.

Note that, although the recovery information setting processing in FIG. 23 and the imaging processing in FIG. 24 are described as recovery information setting processing and imaging processing for a solid-state imaging device 200 having the second redundant circuit, the recovery information setting processing and imaging processing can be similarly executed by recovery information setting processing and imaging processing for a solid-state imaging device 100 having the first redundant circuit.

8. Usage Example of Image Sensor

Figure 25:
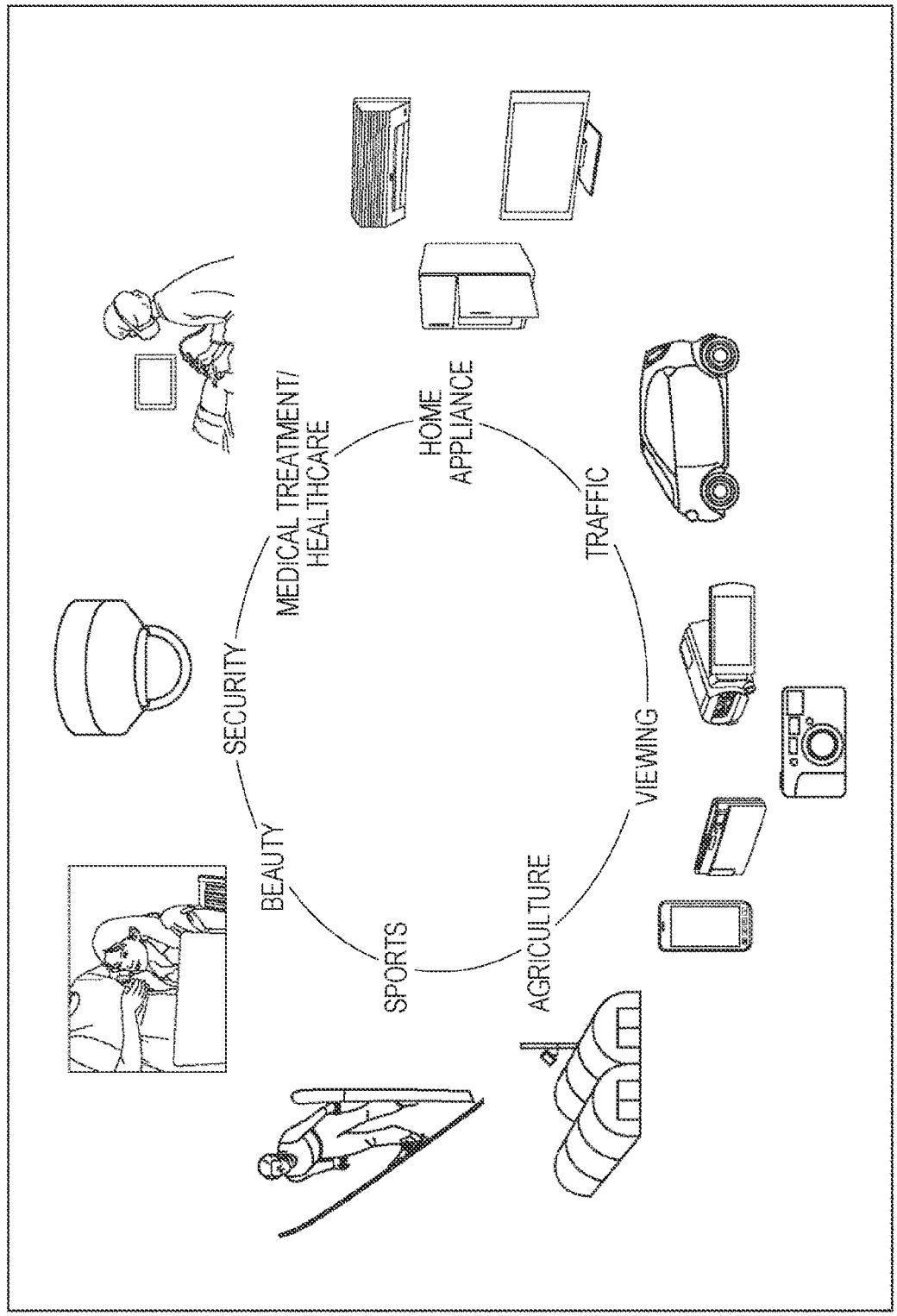
FIG. 25 is a diagram describing a usage example of an image sensor.

FIG. 25 is a diagram illustrating a usage example of an image sensor using the above-described solid-state imaging device 100 or 200.

The image sensor using the solid-state imaging device 100 or 200 provided with the above-described redundant circuit is used in various cases for sensing light such as visible light, infrared light, ultraviolet light, or X-ray as below, for example.

- A device provided to be used for viewing, such as a digital camera or a portable device with a camera function, the device taking an image.
- A device provided to be used for traffic, such as an in-vehicle sensor that takes an image of front, rear, surroundings, inside, or the like of a vehicle for safe driving with automatic stop or the like, recognition of a state of a driver, or the like, a monitoring camera that monitors a traveling vehicle or road, a distance measurement sensor that measures an inter-vehicle distance, or the like.
- A device provided to be used for a home appliance such as a television, a refrigerator, or an air conditioner, in order to take an image of a user gesture and perform apparatus operation according to the gesture.
- A device provided to be used for medical treatment or healthcare, such as an endoscope a device that performs angiography by receiving infrared light, or the like.
- A device provided to be used for security, such as a monitoring camera for crime prevention, a camera for personal authentication, or the like.
- A device provided to be used for beauty, such as a skin measurement device that takes an image of skin or a microscope that takes an image of scalp.
- A device provided to be used for sports, such as an action camera or wearable camera for a sports application.
- A device provided to be used for agriculture, such as a camera for monitoring a condition of a field or crop.

9. Example of Application to Electronic Apparatus

The present technology is not limited to application to a solid-state imaging device. That is, the present technology can be applied to all electronic apparatuses that use a solid-state imaging device for an image capture unit (photoelectric conversion unit), such as an imaging device such as a digital still camera or video camera, a portable terminal device having an imaging function, or a copying machine using a solid-state imaging device in an image reading unit. The solid-state imaging device may be formed as a single chip, or may be formed as a module having an imaging function in which an imaging unit and a signal processing unit or an optical system are packaged together.

Figure 26:
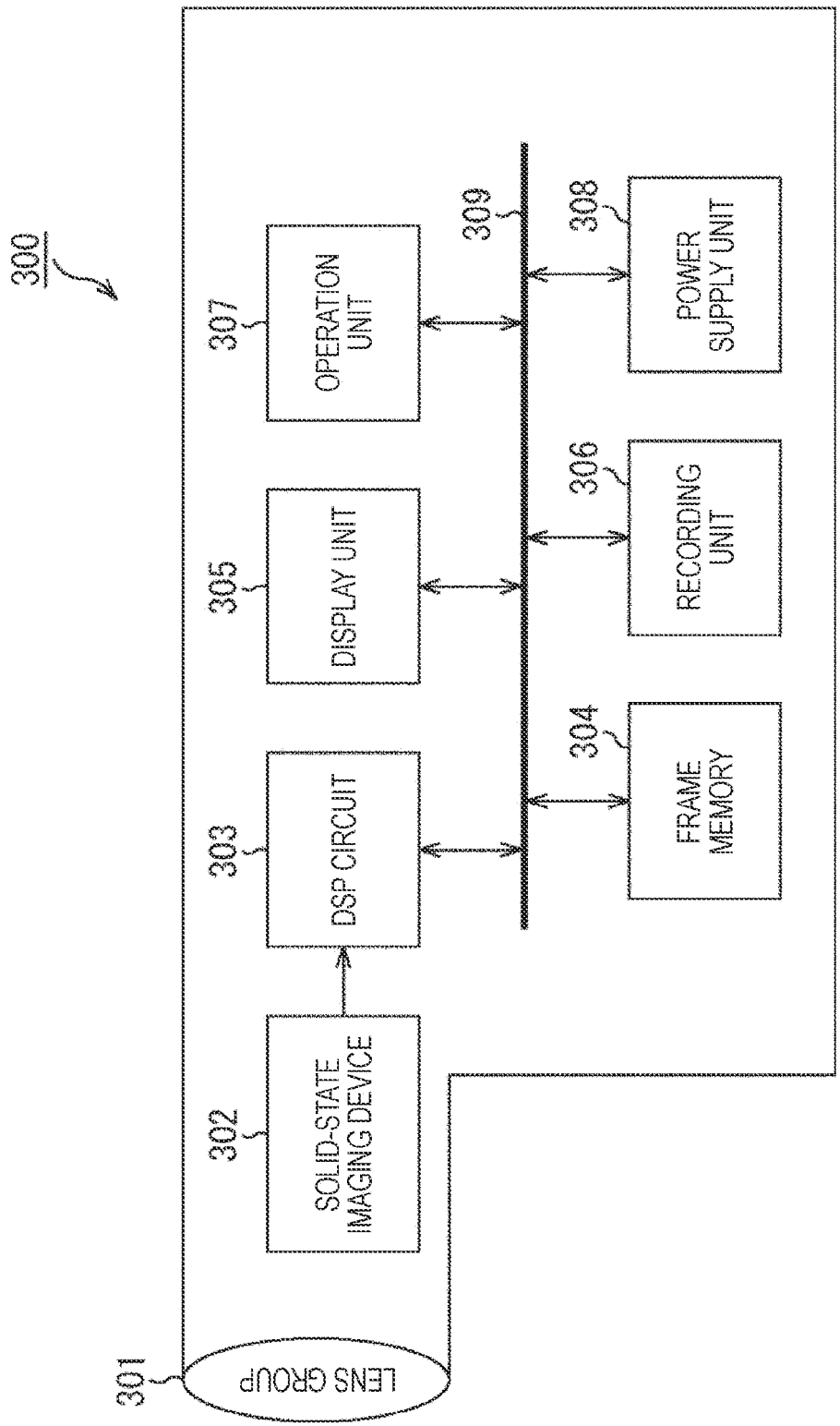
FIG. 26 is a block diagram illustrating a configuration example of an imaging device as an electronic apparatus to which the present technology is applied.

FIG. 26 is a block diagram illustrating a configuration example of an imaging device as an electronic apparatus to which the present technology is applied.

An imaging device 300 in FIG. 26 includes an optical unit 101 including a lens group or the like, a solid-state imaging device (imaging device) 302 for which a configuration of the above-described solid-state imaging device 100 or 200 is adopted, and a digital signal processor (DSP) circuit 303 that is a camera signal processing circuit. Furthermore, the imaging device 300 includes a frame memory 304, a display unit 305, a recording unit 306, an operation unit 307, and a power supply unit 308. The DSP circuit 303, the frame memory 304, the display unit 305, the recording unit 306, the operation unit 307, and the power supply unit 308 are connected to one another via a bus line 309.

An optical unit 301 takes incident light (image light) from a subject and forms an image on an imaging surface of a solid-state imaging device 302. The solid-state imaging device 302 converts an amount of incident light imaged on the imaging surface by the optical unit 301 into an electric signal in units of pixels and outputs the electric signal as a pixel signal. As the solid-state imaging device 302, the solid-state imaging device 100 or 200 described above, that is, a solid-state imaging device having the first redundant circuit including one redundant wiring for n number of signal lines or having the second redundant circuit including one redundant ADC for n number of ADCs, can be used.

For example, the display unit 305 includes a thin display such as a liquid crystal display (LCD) or an organic electro luminescence (EL) display, and displays a moving image or a still image captured by the solid-state imaging device 302. The recording unit 306 records a moving image or a still image captured by the solid-state imaging device 302 on a recording medium such as a hard disk or a semiconductor memory.

Under operation by a user, the operation unit 307 issues an operation command for various functions that the imaging device 300 has. The power supply unit 308 appropriately supplies various power to be operation power supply for the DSP circuit 303, the frame memory 304, the display unit 305, the recording unit 306, and the operation unit 307, to these supply targets.

As described above, by using the solid-state imaging device 100 or 200 having the above-described redundant circuit as the solid-state imaging device 302, yield of the solid-state imaging device can be improved, by which yield of the imaging device can be improved.

10. Example of Application to Endoscopic Surgery System

The technology according to the present disclosure (the present technology) can be applied to various products. For example, the technology according to the present disclosure may be applied to an endoscopic surgery system.

Figure 27:
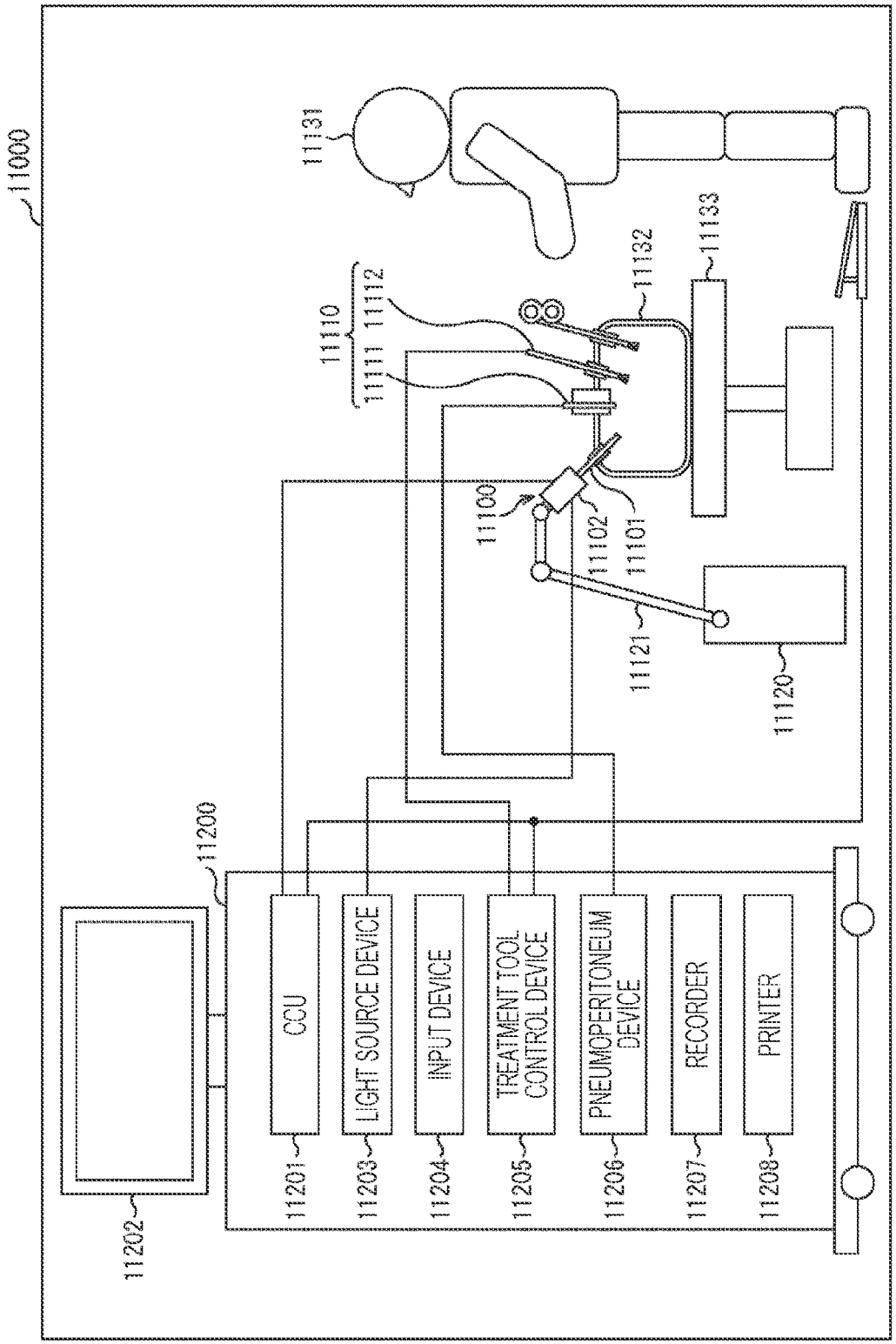
FIG. 27 is a diagram illustrating an example of a schematic configuration of an endoscopic surgery system.

FIG. 27 is a diagram illustrating an example of a schematic configuration of an endoscopic surgery system to which the technology according to the present disclosure (the present technology) may be applied.

FIG. 27 illustrates a surgeon (medical doctor) 11131 performing surgery on a patient 1163 on a patient bed 11133 by using an endoscopic surgery system 11000. As illustrated, the endoscopic surgery system 11000 includes an endoscope 11100, other surgical tools 11110 such as a pneumoperitoneum tube 11111 or an energy treatment tool 11112, a support arm device 11120 that supports the endoscope 11100, and a cart 11200 equipped with various devices for an endoscopic surgery.

The endoscope 11100 includes a lens barrel 11101 of which region having a predetermined length from a tip end is inserted into a body cavity of a patient 1163, and a camera head 11102 connected to a base end of the lens barrel 11101. Although the endoscope 11100 configured as a so-called hard mirror having a hard lens barrel 11101 is illustrated in the illustrated example, the endoscope 11100 may be configured as a so-called flexible mirror having a flexible lens barrel.

An opening in which an objective lens is fitted is provided at the tip end of the lens barrel 11101. A light source device 11203 is connected to the endoscope 11100, and light generated by the light source device 11203 is guided to the tip end of the lens barrel by a light guide extending inside the lens barrel 11101 and is emitted via the objective lens toward an observation target in the body cavity of the patient 1163. Note that the endoscope 11100 may be a forward-viewing endoscope, an oblique-viewing endoscope, or a side-viewing endoscope.

An optical system and an imaging device are provided inside the camera head 11102, and reflected light (observation light) from the observation target is focused on the imaging device by the optical system. The observation light is photoelectrically converted by the imaging device, and an electric signal corresponding to the observation light, that is, an image signal corresponding to an observation image is generated. The image signal is sent as RAW data to a camera control unit (CCU) 11201.

The CCU 11201 includes a central processing unit (CPU), a graphics processing unit (GPU), or the like, and comprehensively controls operation of the endoscope 11100 and a display device 11202. Moreover, the CCU 11201 receives an image signal from the camera head 11102, and performs, on the image signal, various image processing for displaying an image based on the image signal, such as development processing (demosaic processing), for example.

The display device 11202 displays an image based on the image signal that has been subjected to image processing by the CCU 11201 under control by the CCU 11201.

The light source device 11203 includes a light source such as a light emitting diode (LED) for example, and supplies irradiation light for taking an image of an operative site or the like to the endoscope 11100.

An input device 11204 is an input interface to the endoscopic surgery system 11000. The user can input various information or input an instruction to the endoscopic surgery system 11000 via the input device 11204. For example, the user inputs an instruction to change an imaging condition (a type of irradiation light, magnification, focal length, or the like) of the endoscope 11100.

A treatment tool control device 11205 controls the drive of the energy treatment tool 11112 for cauterization or incision of a tissue, blood vessel sealing, or the like. A pneumoperitoneum device 11206 sends gas into the body cavity of the patient 1163 via the pneumoperitoneum tube 11111 in order to inflate the body cavity for a purpose of securing a field of view by the endoscope 11100 and securing work space for the surgeon. A recorder 11207 is a device capable of recording various information related to surgery. A printer 11208 is a device capable of printing various information related to a surgery in various formats such as text, an image, or a graph.

Note that the light source device 11203 that supplies irradiation light to the endoscope 11100 for when taking an image of an operative site can include, for example, LED, a laser light source, or a white light source configured by a combination thereof. In a case where a white light source is configured by a combination of RGB laser light sources, output intensity and output timing of each color (each wavelength) can be controlled with high accuracy, and therefore, the light source device 11203 can adjust white balance of a captured image. Furthermore, in this case, it is possible to capture images corresponding to each of the RGB on a time-division basis by irradiating the observation target with laser light from each of the RGB laser light sources on a time-division basis and by controlling drive of the imaging device of the camera head 11102 in synchronization with the irradiation timing. According to the method, a color image can be obtained without providing a color filter on the imaging device.

Furthermore, the drive by the light source device 11203 may be controlled so as to change intensity of output light at predetermined time intervals. It is possible to generate an image with a so-called high dynamic range without underexposure or overexposure by controlling drive of the imaging device of the camera head 11102 in synchronization with timing of changing the light intensity to acquire images on a time-division basis, and combining the images.

Furthermore, the light source device 11203 may be configured to be able to supply light having a predetermined wavelength band corresponding to special light observation. In special light observation, for example, so-called narrow band imaging is performed in which an image of a predetermined tissue such as a blood vessel of mucous membrane surface layer is taken with high contrast by utilizing wavelength dependence of light absorption in a body tissue to emit light with a bandwidth narrower than a bandwidth of irradiation light (that is, white light) in normal observation. Alternatively, in the special light observation, fluorescent observation may be performed in which an image is obtained by fluorescence being generated by emission of excitation light. In fluorescent observation, it is possible to irradiate a body tissue with excitation light to observe fluorescence from the body tissue (autofluorescence observation), or to locally inject reagent such as indocyanine green (ICG) into the body tissue and irradiate the body tissue with excitation light corresponding to a fluorescence wavelength of the reagent to obtain a fluorescent image. The light source device 11203 may be configured to be capable of supplying narrow-band light and/or excitation light corresponding to such special light observation.

Figure 28:
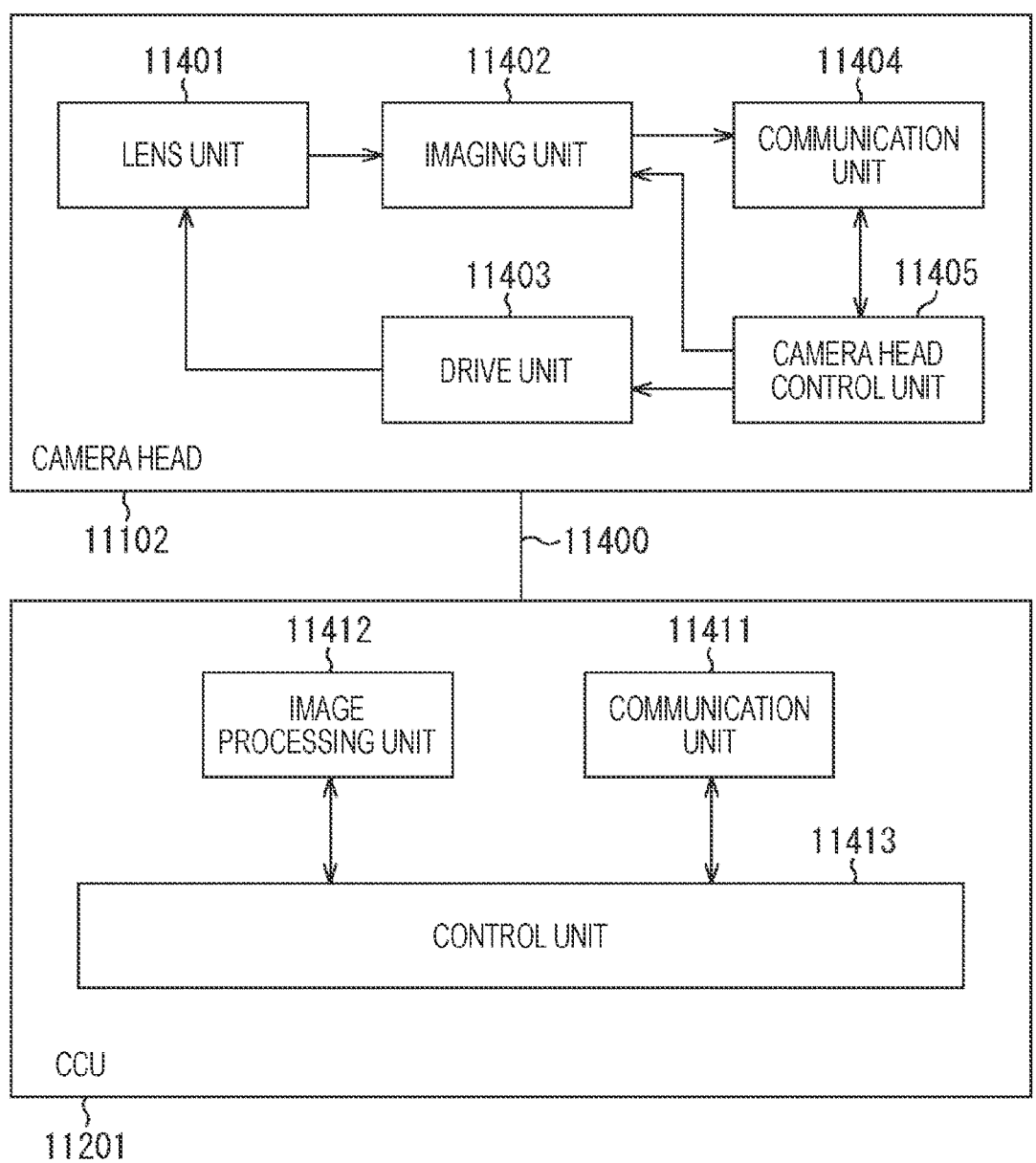
FIG. 28 is a block diagram illustrating an example of a functional configuration of a camera head and a CCU.

FIG. 28 is a block diagram illustrating an example of a functional configuration of the camera head 11102 and the CCU 11201 illustrated in FIG. 27.

The camera head 11102 has a lens unit 11401, an imaging unit 11402, a drive unit 11403, a communication unit 11404, and a camera head control unit 11405. The CCU 11201 has a communication unit 11411, an image processing unit 11412, and a control unit 11413. The camera head 11102 and the CCU 11201 are communicatively connected to each other by a transmission cable 11400.

The lens unit 11401 is an optical system provided at a connection part with the lens barrel 11101. Observation light taken in from the tip end of the lens barrel 11101 is guided to the camera head 11102 and is incident on the lens unit 11401. The lens unit 11401 is configured by a plurality of lenses including a zoom lens and a focus lens combined together.

The imaging unit 11402 includes an imaging device. The imaging device that constitutes the imaging unit 11402 may be one (so-called single plate type) or multiple (so-called multi-plate type). In a case where the imaging unit 11402 has a multi-plate type configuration, for example, each of the imaging devices may generate an image signal corresponding to each RGB, and a color image may be obtained by a combination of them. Alternatively, the imaging unit 11402 may be configured having a pair of imaging devices for acquiring each of image signals for a right eye and a left eye corresponding to a three-dimensional (3D) display. The 3D display enables the surgeon 11131 to more accurately grasp depth of a living tissue at the operative site. Note that, in a case where the imaging unit 11402 has a multi-plate type configuration, a plurality of systems of the lens units 11401 may be provided corresponding to the respective imaging devices.

Furthermore, the imaging unit 11402 does not necessarily have to be provided on the camera head 11102. For example, the imaging unit 11402 may be provided inside the lens barrel 11101 immediately behind the objective lens.

The drive unit 11403 includes an actuator, and the zoom lens and focus lens of the lens unit 11401 are moved by a predetermined distance along an optical axis under control by the camera head control unit 11405. With this arrangement, magnification and focus of an image captured by the imaging unit 11402 may be adjusted as appropriate.

The communication unit 11404 includes a communication device for sending or receiving various information to and from the CCU 11201. The communication unit 11404 sends the image signal obtained from the imaging unit 11402 as RAW data to the CCU 11201 via the transmission cable 11400.

Furthermore, the communication unit 11404 receives a control signal for controlling drive of the camera head 11102 from the CCU 11201 and supplies the control signal to the camera head control unit 11405. The control signal includes information regarding an imaging condition such as, for example, information that specifies a frame rate of a captured image, information that specifies an exposure value at a time of imaging, and/or information that specifies magnification and focus of the captured image.

Note that the above-described imaging conditions such as a frame rate, an exposure value, magnification, or focus may be appropriately specified by the user, or may be automatically set by the control unit 11413 of the CCU 11201 on the basis of the acquired image signal. In the latter case, the endoscope 11100 is equipped with a so-called auto exposure (AE) function, auto focus (AF) function, and auto white balance (AWB) function.

The camera head control unit 11405 controls drive of the camera head 11102 on the basis of a control signal from the CCU 11201 received via the communication unit 11404.

The communication unit 11411 includes a communication device for sending or receiving various information to and from the camera head 11102. The communication unit 11411 receives an image signal sent from the camera head 11102 via the transmission cable 11400.

Furthermore, the communication unit 11411 sends a control signal for controlling drive of the camera head 11102 to the camera head 11102. An image signal or a control signal can be sent by telecommunication, optical communication, or the like.

The image processing unit 11412 performs various image processing on an image signal that is RAW data sent from the camera head 11102.

The control unit 11413 performs various controls related to imaging of an operative site or the like by the endoscope 11100, and to display of the captured image obtained by the imaging of the surgical site, or the like. For example, the control unit 11413 generates a control signal for controlling drive of the camera head 11102.

Furthermore, on the basis of an image signal on which image processing has been performed by the image processing unit 11412, the control unit 11413 causes the display device 11202 to display a captured image of an operative site or the like. At this time, the control unit 11413 may recognize various objects in the captured image by using various image recognition techniques. For example, the control unit 11413 can recognize a surgical tool such as forceps, a specific living body part, bleeding, mist when using the energy treatment tool 11112, or the like by detecting a shape, color, or the like of an edge of an object included in the captured image. When displaying the captured image on the display device 11202, the control unit 11413 may superimpose and display various surgery support information on an image of the operative site by using the recognition result. By the surgery support information being superimposed and displayed, and presented to the surgeon 11131, burden on the surgeon 11131 can be reduced, or the surgeon 11131 can surely proceed with the surgery.

The transmission cable 11400 that connects the camera head 11102 and the CCU 11201 is an electric signal cable that supports electric signal communication, an optical fiber that supports optical communication, or a composite cable thereof.

Here, although communication is performed by wire using the transmission cable 11400 in the illustrated example, communication between the camera head 11102 and the CCU 11201 may be performed wirelessly.

An example of an endoscopic surgery system to which the technology according to the present disclosure may be applied has been described above. The technology according to the present disclosure may be applied to the imaging unit 11402 of the camera head 11102 among the configurations described above. Specifically, the solid-state imaging device 100 or 200 described above can be applied as the imaging unit 11402. By applying the technology according to the present disclosure to the imaging unit 11402, yield of the imaging unit 11402 can be improved, by which yield of the endoscopic surgery system can be improved.

Note that, although the endoscopic surgery system has been described here as an example, the technology according to the present disclosure may be applied to another, for example, a microscopic surgery system, or the like.

11. Example of Application to Mobile Object

The technology according to the present disclosure (the present technology) can be applied to various products. For example, the technology according to the present disclosure may be implemented as a device mounted on a mobile object of any kind such as an automobile, an electric vehicle, a hybrid electric vehicle, a motorcycle, a bicycle, a personal mobility, an airplane, a drone, a ship, or a robot.

Figure 29:
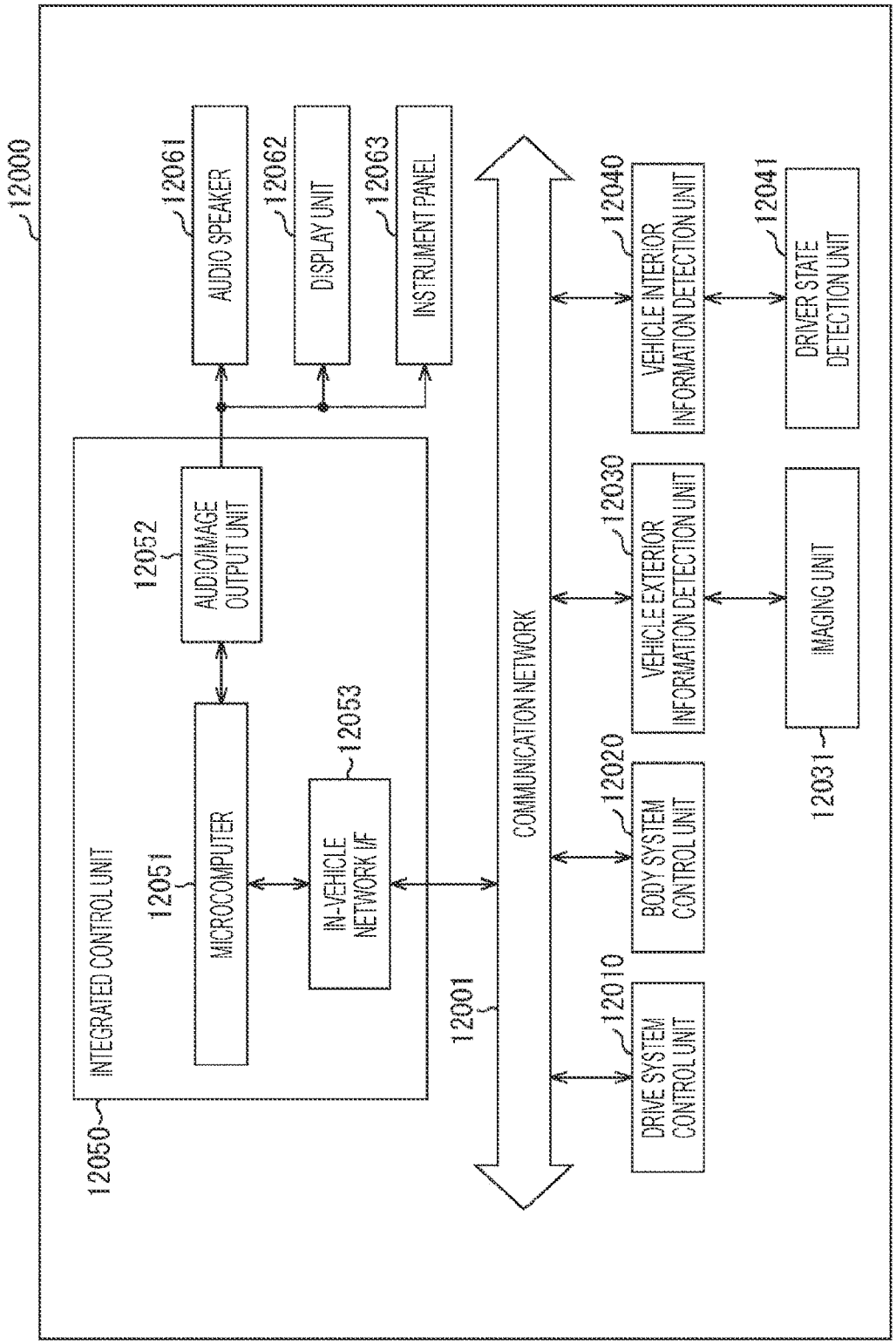
FIG. 29 is a block diagram illustrating an example of a schematic configuration of a vehicle control system.

FIG. 29 is a block diagram illustrating a schematic configuration example of a vehicle control system as an example of a mobile object control system to which the technology according to the present disclosure may be applied.

A vehicle control system 12000 includes a plurality of electronic control units connected via a communication network 12001. In the example illustrated in FIG. 29, the vehicle control system 12000 includes a drive system control unit 12010, a body system control unit 12020, a vehicle exterior information detection unit 12030, a vehicle interior information detection unit 12040, and an integrated control unit 12050. Furthermore, a microcomputer 12051, an audio/image output unit 12052, and an in-vehicle network interface (I/F) 12053 are illustrated as a functional configuration of the integrated control unit 12050.

The drive system control unit 12010 controls operation of a device related to a drive system of a vehicle according to various programs. For example, the drive system control unit 12010 functions as a control device for a drive force generation device for generating drive force, such as an internal combustion engine or a drive motor, of a vehicle, a drive force transmission mechanism for transmitting driving force to wheels, a steering mechanism that adjusts a steering angle of the vehicle, a braking device for generating braking force of the vehicle, or the like.

The body system control unit 12020 controls operation of various devices mounted on a vehicle body according to various programs. For example, the body system control unit 12020 functions as a control device for a keyless entry system, a smart key system, a power window device, or various lamps such as headlamps, back lamps, brake lamps, blinkers, or fog lamps. In this case, a waveform transmitted from a portable device that substitutes for a key or a signal of various switches may be input to the body system control unit 12020. The body system control unit 12020 receives input of the radio wave or signal and controls a vehicle door lock device, a power window device, lamps, or the like.

The vehicle exterior information detection unit 12030 detects information outside a vehicle equipped with the vehicle control system 12000. For example, an imaging unit 12031 is connected to the vehicle exterior information detection unit 12030 The vehicle exterior information detection unit 12030 causes the imaging unit 12031 to capture an image of outside of the vehicle and receives the captured image. The vehicle exterior information detection unit 12030 may perform object detection processing or distance detection processing of a person, a vehicle, an obstacle, a sign, characters on a road surface, or the like on the basis of the received image.

The imaging unit 12031 is an optical sensor that receives light and outputs an electric signal corresponding to an amount of light received. The imaging unit 12031 can output an electric signal as an image or can output the electric signal as distance measurement information. Furthermore, light received by the imaging unit 12031 may be visible light or invisible light such as infrared light.

The vehicle interior information detection unit 12040 detects information of inside a vehicle. For example, a driver state detection unit 12041 that detects a state of a driver is connected to the vehicle interior information detection unit 12040. The driver state detection unit 12041 may include, for example, a camera that captures an image of the driver, and the vehicle interior information detection unit 12040 may calculate a degree of fatigue or concentration of the driver on the basis of detection information input from the driver state detection unit 12041 or may discriminate whether or not the driver is dozing off.

The microcomputer 12051 can calculate a control target values of the drive force generation device, the steering mechanism, or the braking device on the basis of information of inside and outside of the vehicle, the information being acquired by the vehicle exterior information detection unit 12030 or the vehicle interior information detection unit 12040, and can output a control command to the drive system control unit 12010. For example, the microcomputer 12051 can perform cooperative control for a purpose of implementing a function of an advanced driver assistance system (ADAS) including collision avoidance or impact mitigation of a vehicle, following traveling based on an inter-vehicle distance, vehicle speed maintenance traveling, vehicle collision warning, lane deviation warning, or the like.

Furthermore, the microcomputer 12051 can perform cooperative control for a purpose of autonomous driving or the like by which a vehicle travels autonomously without depending on operation by a driver, by controlling the drive force generation device, the steering mechanism, or the braking device on the basis of information of surroundings of the vehicle, the information being acquired by the vehicle exterior information detection unit 12030 or the vehicle interior information detection unit 12040.

Furthermore, the microcomputer 12051 can output a control command to the body system control unit 12020 on the basis of information of outside of the vehicle, the information being acquired by the vehicle exterior information detection unit 12030. For example, the microcomputer 12051 can control the headlamps according to a position of a preceding vehicle or oncoming vehicle detected by the vehicle exterior information detection unit 12030, and can perform cooperative control, such as switching from high beams to low beams, for a purpose of antidazzle.

The audio/image output unit 12052 sends an output signal of at least one of audio or an image to an output device capable of visually or audibly notifying an occupant of the vehicle or outside of the vehicle of information. In the example in FIG. 29, an audio speaker 12061, a display unit 12062, and an instrument panel 12063 are exemplified as output devices. The display unit 12062 may include, for example, at least one of an onboard display or a head-up display.

Figure 30:
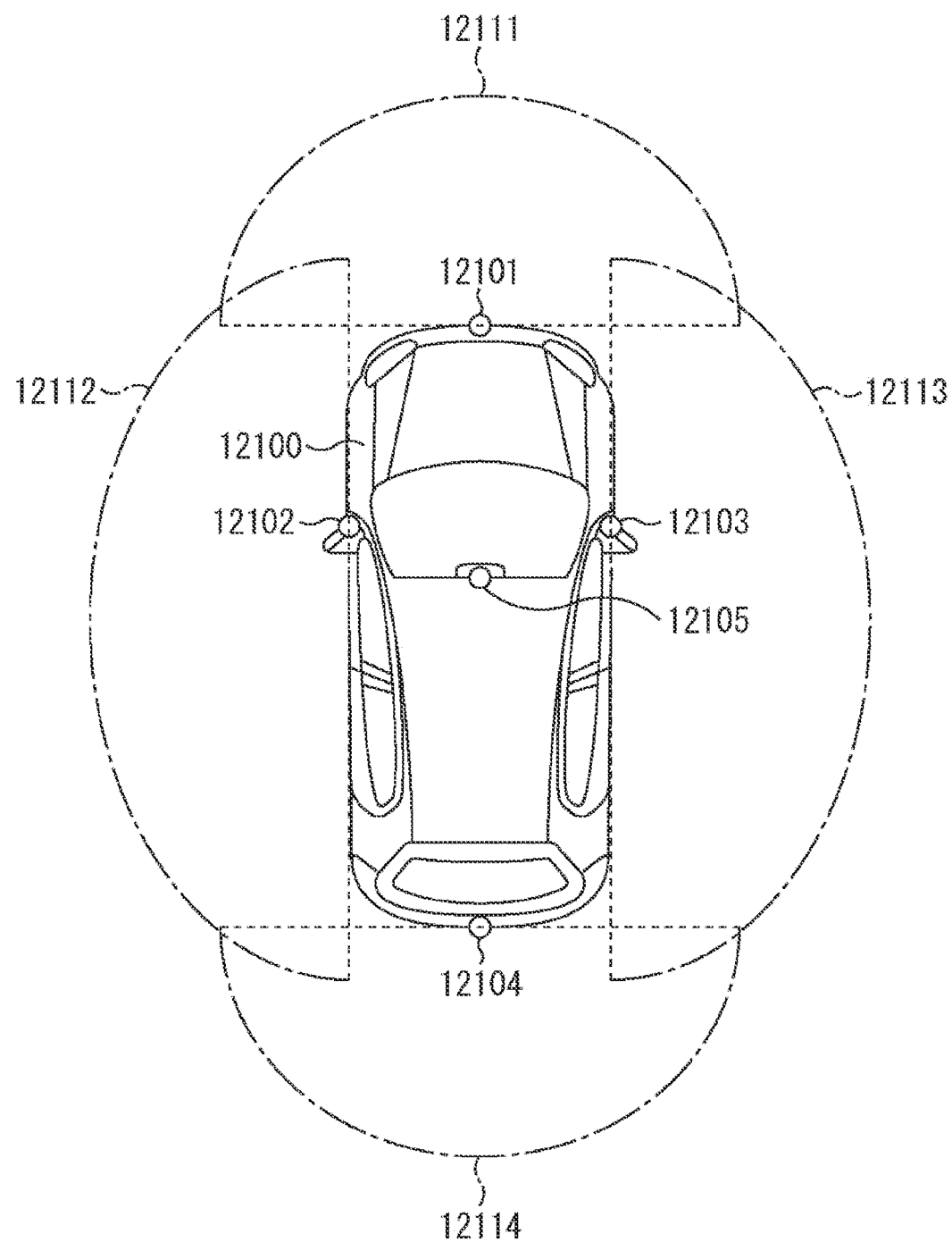
FIG. 30 is an explanatory diagram illustrating an example of installation positions of a vehicle exterior information detection unit and imaging units.

FIG. 30 is a diagram illustrating an example of installation positions of the imaging unit 12031.

In FIG. 30, a vehicle 12100 has imaging units 12101, 12102, 12103, 12104, and 12105 as the imaging unit 12031.

The imaging units 12101, 12102, 12103, 12104, and 12105 are provided at positions such as, for example, a front nose, side mirrors, rear bumper, and back door of the vehicle 12100, and an upper part of a front window, or the like, of a vehicle interior of the vehicle 12100. The imaging unit 12101 provided on the front nose and the imaging unit 12105 provided on the upper part of the front window of the vehicle interior mainly acquire an image of a view ahead of the vehicle 12100. The imaging units 12102 and 12103 provided on the side mirrors mainly acquire images of views at sides of the vehicle 12100. The imaging unit 12104 provided on the rear bumper or the back door mainly acquires an image of a rear view of the vehicle 12100. The images of views ahead acquired by the imaging units 12101 and 12105 are mainly used for detecting a preceding vehicle, a pedestrian, an obstacle, a traffic light, a traffic sign, a lane, or the like.

Note that FIG. 30 illustrates an example of shooting ranges of the imaging units 12101 to 12104. The imaging range 12111 indicates an imaging range of the imaging unit 12101 provided on the front nose, the imaging ranges 12112 and 12113 indicate imaging ranges of the imaging units 12102 and 12103 provided on the side mirrors, respectively, and the imaging range 12114 indicates an imaging range of the imaging unit 12104 provided on the rear bumper or on the back door. For example, by superimposing the image data captured by the imaging units 12101 to 12104, a bird's-eye view image of the vehicle 12100 as viewed from above can be obtained.

At least one of the imaging units 12101 to 12104 may have a function of acquiring distance information. For example, at least one of the imaging units 12101 to 12104 may be a stereo camera including a plurality of imaging devices, or may be an imaging device having pixels for phase difference detection.

For example, the microcomputer 12051 can extract, as a preceding vehicle, a three-dimensional object that is especially closest to the vehicle 12100 on a path of travel and is traveling in the substantially same direction as the vehicle 12100 travels at a predetermined speed (for example, 0 km/h or more) by obtaining distances to each three-dimensional object from within the imaging ranges 12111 to 12114 and time variation in the distances (relative speed with respect to the vehicle 12100) on the basis of distance information obtained from the imaging units 12101 to 12104. Moreover, the microcomputer 12051 can set an inter-vehicle distance to be secured in front of the preceding vehicle in advance, and can perform automatic braking control (including following stop control), automatic acceleration control (including following stop control), or the like. Thus, cooperative control can be performed for a purpose of autonomous driving, or the like, by which a vehicle travels autonomously without depending on operation by a driver.

For example, on the basis of the distance information obtained from the imaging units 12101 to 12104, the microcomputer 12051 can extract three-dimensional object data related to three-dimensional objects and classify the three-dimensional objects into a two-wheeled vehicle, an ordinary vehicle, a large vehicle, a pedestrian, and another three-dimensional object such as an electric pole, to use the three-dimensional object data for automatic avoidance of an obstacle. For example, the microcomputer 12051 identifies obstacles around the vehicle 12100 into obstacles that are visible to the driver of the vehicle 12100 and obstacles that are difficult to see. Then, the microcomputer 12051 judges a collision risk indicating a risk of collision with each obstacle, and when the collision risk is equal to or higher than the set value and there is a possibility of collision, an alarm is output to the driver via the audio speaker 12061 or the display unit 12062, or forced deceleration or avoidance steering is performed via the drive system control unit 12010, by which driving support for collision avoidance can be provided.

At least one of the imaging units 12101 to 12104 may be an infrared camera that detects an infrared ray. For example, the microcomputer 12051 can recognize a pedestrian by deciding whether or not a pedestrian is present in an image captured by the imaging units 12101 to 12104. Such pedestrian recognition is performed by, for example, a procedure for extracting characteristic points in images captured by the imaging units 12101 to 12104 as infrared cameras and a procedure for performing matching processing on a series of characteristic points indicating an outline of an object to discriminate whether or not the object is a pedestrian. When the microcomputer 12051 decides that a pedestrian is present in an image captured by the imaging units 12101 to 12104 and recognizes the pedestrian, the audio/image output unit 12052 controls the display unit 12062 to superimpose and display square contour lines for emphasis on the recognized pedestrian. Furthermore, the audio/image output unit 12052 may control the display unit 12062 so as to display, at a desired position, an icon or the like indicating a pedestrian.

An example of a vehicle control system to which the technology according to the present disclosure may be applied has been described above. The technology according to the present disclosure may be applied to the imaging unit 12031 among the configurations described above. Specifically, the solid-state imaging device 100 or 200 described above can be applied as the imaging unit 12031. By applying the technology according to the present disclosure to the imaging unit 12031 that is downsized yet, yield of the imaging unit 12031 can be improved, by which yield of the vehicle control system can be improved.

Note that the effects described herein are only examples, and the effects of the present technology are not limited to these effects. Effects other than those described in the present specification may also be obtained.

Note that the present technology can have the following configurations.

(1) A solid-state imaging device including:
a pixel array unit in which a plurality of pixels is two-dimensionally arranged in a matrix;
one redundant wiring provided for n number of signal lines that transmit a pixel signal from the pixels; and
one or more redundant switches that connect a signal line and the of the n number of signal lines and the redundant wiring.

(2) The solid-state imaging device according to (1), further including
a plurality of the redundant switches that connects the signal line and the redundant wiring.

(3) The solid-state imaging device according to (1) or (2), in which the n number of signal lines and one redundant wiring are arranged for one pixel column.

(4) The solid-state imaging device according to (1) or (2), in which the n number of signal lines and one redundant wiring are arranged for n number of pixel columns.

(5) The solid-state imaging device according to any one of (1) to (4),
in which the pixel array unit includes, as the pixel,
a first pixel having a pixel circuit that receives and photoelectrically converts incident light and then outputs the pixel signal, and
a second pixel having the redundant switch.

(6) The solid-state imaging device according to any one of (1) to (4),
in which the pixel array unit includes, as the pixel,
a first pixel having a pixel circuit that receives and photoelectrically converts incident light and then outputs the pixel signal, and
a second pixel having the pixel circuit and the redundant switch.

(7) The solid-state imaging device according to any one of (1) to (4),
in which all the pixels in the pixel array unit have a pixel circuit that receives and photoelectrically converts incident light and then outputs the pixel signal, and
the redundant switch.

(8) The solid-state imaging device according to any one of (1) to (4),
in which the pixels having a pixel circuit that receives and photoelectrically converts incident light and then outputs the pixel signal are two-dimensionally arranged in a matrix in the pixel array unit, and,
between a first pixel row and a second pixel row, there is a row on which the redundant switch is arranged.

(9) The solid-state imaging device according to any one of (1) to (4),
in which the pixels having a pixel circuit that receives and photoelectrically converts incident light and then outputs the pixel signal are two-dimensionally arranged in a matrix in the pixel array unit, and
the redundant switch is arranged outside of the pixel array unit.

(10) The solid-state imaging device according to any one of (1) to (9),
in which a constant current source circuit is connected to each of the signal line and the redundant wiring.

(11) The solid-state imaging device according to any one of (1) to (10), further including:
a storage unit that stores recovery information that relieves wiring failure in the pixel array unit; and a redundant control circuit that drives the one or more redundant switches on the basis of the recovery information.

(12) A solid-state imaging device including:
a pixel array unit in which a plurality of pixels is two-dimensionally arranged in a matrix;
an ADC that converts an analog pixel signal output by the pixel in the pixel array unit into digital the pixel signal;
a signal line that is connected to the ADC and transmits a pixel signal from the pixel to the ADC;
a redundant ADC arranged for each of a plurality of the ADCs; and
a selection unit that selects any of a plurality of the signal lines, and connects selected the signal line and the redundant ADC.

(13) The solid-state imaging device according to (12),
in which the ADC is provided with the signal line on a one-to-one basis, and
the redundant ADC is provided for a plurality of the signal lines.

(14) The solid-state imaging device according to (12) or (13), further including:
a storage unit that stores recovery information that relieves wiring failure in the pixel array unit; and
a selector control unit that controls the selection unit on the basis of the recovery information.

(15) The solid-state imaging device according to any one of (12) to (14), further including
a data selection unit that selects output data of either the ADC or the redundant ADC.

(16) An electronic apparatus including
the solid-state imaging device according to any one of (1) to (15).

REFERENCE SIGNS LIST

11 Pixel array unit
12 ADC unit
13 A-D conversion unit
14 Pixel drive circuit
16 (16A, 16B) Signal processing circuit
21 Pixel
22 Constant current source circuit
23 ADC
41 Comparator (comparator)
42 Up/down counter
drl Drive signal line
hsl Drive signal line
vsl Redundant wiring
vsl Pixel signal line
vsl Redundant wiring
61 Redundant switch
75 Pixel
76 Redundant switch row
100 Solid-state imaging device
111 ROM
112 Redundant control circuit
151 MUX
152 ADC
200 Solid-state imaging device
211 MUX unit
212 ADC unit
221 ROM
222 Redundant control circuit
223 Data selection unit
300 Imaging device
302 Solid-state imaging device

The invention claimed is:

1. A solid-state imaging device, comprising:
a pixel array unit that includes a plurality of pixels two-dimensionally arranged in a matrix;
one redundant wiring for n number of signal lines, wherein the n number of signal lines transmit a pixel signal from the plurality of pixels; and
a plurality of redundant switches, wherein
a first redundant switch of the plurality of redundant switches is configured to connect a first signal line of the n number of signal lines to the one redundant wiring, and
a second redundant switch of the plurality of redundant switches is configured to connect a second signal line of the n number of signal lines to the one redundant wiring.

2. The solid-state imaging device according to claim 1, wherein the n number of signal lines and the one redundant wiring are for one pixel column in the pixel array unit.

3. The solid-state imaging device according to claim 1, wherein the n number of signal lines and the one redundant wiring are for n number of pixel columns in the pixel array unit.

4. The solid-state imaging device according to claim 1, wherein the plurality of pixels includes
a first pixel that includes a pixel circuit configured to receive and photoelectrically convert incident light and then output the pixel signal, and
a second pixel that includes a third redundant switch of the plurality of redundant switches.

5. The solid-state imaging device according to claim 1, wherein the plurality of pixels includes
a first pixel that includes a pixel circuit configured to receive and photoelectrically convert incident light and then output the pixel signal, and
a second pixel that includes the pixel circuit and a third redundant switch of the plurality of redundant switches.

6. The solid-state imaging device according to claim 1, wherein each pixel of the plurality of pixels in the pixel array unit includes:
a pixel circuit configured to receive and photoelectrically convert incident light and then output the pixel signal, and
a corresponding redundant switch of the plurality of redundant switches.

7. The solid-state imaging device according to claim 1, wherein
each pixel of the plurality of pixels includes a pixel circuit configured to receive and photoelectrically convert incident light and then output the pixel signal, and
a third redundant switch of the plurality of redundant switches is in a row that is between a first pixel row and a second pixel row in the pixel array unit.

8. The solid-state imaging device according to claim 1, wherein
each pixel of the plurality of pixels includes a pixel circuit configured to receive and photoelectrically convert incident light and then output the pixel signal, and
a third redundant switch of the plurality of redundant switches is outside of the pixel array unit.

9. The solid-state imaging device according to claim 1, wherein a constant current source circuit is connected to each signal line of the n number of signal lines and the one redundant wiring.

10. The solid-state imaging device according to claim 1, further comprising:

a storage unit configured to store recovery information that relieves wiring failure in the pixel array unit; and a redundant control circuit configured to drive the plurality of redundant switches based on the recovery information.

11. An electronic apparatus comprising the solid-state imaging device according to claim 1.

12. A solid-state imaging device, comprising:

a pixel array unit that includes a plurality of pixels two-dimensionally arranged in a matrix, wherein the plurality of pixels is configured to output first analog pixel signals;

a plurality of ADCs configured to convert the first analog pixel signals output by the plurality of pixels unit into digital pixel signals;

a plurality of signal lines, wherein
   a first set of ADCs of the plurality of ADCs is on a first side of the plurality of signal lines,
   a second set of ADCs of the plurality of ADCs is on a second side of the plurality of signal lines opposite to the first side,
   a first set of signal lines of the plurality of signal lines is connected to the first set of ADCs,
   the first set of signal lines is configured to transmit second analog pixel signals from a first set of pixels of the plurality of pixels to the first set of ADCs,
   a second set of signal lines of the plurality of signal lines is connected to the second set of ADCs, and
   the second set of signal lines is configured to transmit third analog pixel signals from a second set of pixels of the plurality of pixels to the second set of ADCs;

a plurality of redundant ADCs, wherein
   a first redundant ADC of the plurality of redundant ADCs is for the first set of ADCs and is on the first side, and
   a second redundant ADC of the plurality of redundant ADCs is for the second set of ADCs and is on the second side opposite to the first side; and a selection unit configured to select a signal line of the first set of signal lines, and connect the selected signal line to the first redundant ADC.

13. The solid-state imaging device according to claim 12, wherein
   the first set of signal lines is connected to the first set of ADCs on a one-to-one basis, and
   the first redundant ADC is for the first set of signal lines.

14. The solid-state imaging device according to claim 12, further comprising:
   a storage unit configured to store recovery information that relieves wiring failure in the pixel array unit; and
   a selector control unit configured to control the selection unit based on the recovery information.

15. The solid-state imaging device according to claim 12, further comprising a data selection unit configured to select output data of either an ADC of the first set of ADCs or the first redundant ADC.

* * * * *